United States Patent
Choi et al.

(10) Patent No.: US 11,152,317 B2
(45) Date of Patent: Oct. 19, 2021

(54) SEMICONDUCTOR DEVICE INCLUDING INTERCONNECTION STRUCTURE INCLUDING COPPER AND TIN AND SEMICONDUCTOR PACKAGE INCLUDING THE SAME

(71) Applicant: SAMSUNG ELECTRONICS CO., LTD., Suwon-si (KR)

(72) Inventors: Ju-Il Choi, Seongnam-si (KR); Pil-Kyu Kang, Hwaseong-si (KR); Hoechul Kim, Seoul (KR); Hoonjoo Na, Seoul (KR); Jaehyung Park, Anyang-si (KR); Seongmin Son, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 129 days.

(21) Appl. No.: 16/404,841

(22) Filed: May 7, 2019

(65) Prior Publication Data
US 2020/0098711 A1 Mar. 26, 2020

(30) Foreign Application Priority Data
Sep. 20, 2018 (KR) .......................... 10-2018-0113157

(51) Int. Cl.
*H01L 23/00* (2006.01)
*H01L 25/16* (2006.01)
(Continued)

(52) U.S. Cl.
CPC .............. *H01L 24/05* (2013.01); *H01L 24/08* (2013.01); *H01L 25/167* (2013.01);
(Continued)

(58) Field of Classification Search
CPC . H01L 24/05; H01L 24/08; H01L 2224/0508; H01L 2224/05111; H01L 2224/05147
(Continued)

(56) References Cited

U.S. PATENT DOCUMENTS 6,130,161 A 10/2000 Ashley et al.
7,385,293 B2 * 6/2008 Mizuno ..................... C22C 9/00
257/762

(Continued)

FOREIGN PATENT DOCUMENTS

KR 10-2002-0053610 A 7/2002
KR 10-0443796 B1 8/2004
KR 10-2005-0067830 A 7/2005

*Primary Examiner* — Robert T Huber
(74) *Attorney, Agent, or Firm* — Lee IP Law, P.C.

(57) ABSTRACT

A semiconductor device and a semiconductor package, the device including a pad interconnection structure that penetrates a first buffer dielectric layer and a second buffer dielectric layer, wherein the pad interconnection structure includes copper and tin, the pad interconnection structure includes a central part, a first intermediate part surrounding the central part; a second intermediate part surrounding the first intermediate part, and an outer part surrounding the second intermediate part, a grain size of the outer part is less than a grain size of the second intermediate part, the grain size of the second intermediate part is less than a grain size of the first intermediate part, and the grain size of the first intermediate part is less than a grain size of the central part.

17 Claims, 14 Drawing Sheets

(51) Int. Cl.
*H01L 23/31* (2006.01)
*H01L 27/146* (2006.01)

(52) U.S. Cl.
CPC .......... *H01L 23/3128* (2013.01); *H01L 24/03* (2013.01); *H01L 24/29* (2013.01); *H01L 24/32* (2013.01); *H01L 24/80* (2013.01); *H01L 27/14621* (2013.01); *H01L 27/14627* (2013.01); *H01L 2224/024* (2013.01); *H01L 2224/02372* (2013.01); *H01L 2224/02373* (2013.01); *H01L 2224/039* (2013.01); *H01L 2224/0346* (2013.01); *H01L 2224/03614* (2013.01); *H01L 2224/03616* (2013.01); *H01L 2224/0508* (2013.01); *H01L 2224/05082* (2013.01); *H01L 2224/05111* (2013.01); *H01L 2224/05124* (2013.01); *H01L 2224/05147* (2013.01); *H01L 2224/05155* (2013.01); *H01L 2224/05166* (2013.01); *H01L 2224/05181* (2013.01); *H01L 2224/05184* (2013.01); *H01L 2224/05564* (2013.01); *H01L 2224/05572* (2013.01); *H01L 2224/05584* (2013.01); *H01L 2224/05611* (2013.01); *H01L 2224/05647* (2013.01); *H01L 2224/08145* (2013.01); *H01L 2224/2919* (2013.01); *H01L 2224/32225* (2013.01); *H01L 2224/8083* (2013.01)

(58) Field of Classification Search
USPC .................................. 257/777, 750, 751, 762
See application file for complete search history.

(56) References Cited

U.S. PATENT DOCUMENTS

| | | |
|---|---|---|
| 9,461,007 B2 | 10/2016 | Chun et al. |
| 9,728,521 B2 | 8/2017 | Tsai et al. |
| 9,947,580 B2 | 4/2018 | Yang |
| 9,953,941 B2 | 4/2018 | Enquist |
| 2015/0076649 A1* | 3/2015 | Kim .................. H01L 27/14689 257/446 |
| 2018/0131849 A1 | 5/2018 | Mabuchi |

* cited by examiner

SEMICONDUCTOR DEVICE INCLUDING INTERCONNECTION STRUCTURE INCLUDING COPPER AND TIN AND SEMICONDUCTOR PACKAGE INCLUDING THE SAME

CROSS-REFERENCE TO RELATED APPLICATION

Korean Patent Application No. 10-2018-0113157 filed on Sep. 20, 2018 in the Korean Intellectual Property Office, and entitled: "Semiconductor Device and Semiconductor Package Including the Same," is incorporated by reference herein in its entirety.

BACKGROUND

1. Field

Embodiments relate to a semiconductor device and a semiconductor package including the same.

2. Description of the Related Art

Semiconductor devices are widely used in the electronic industry because of their small size, multi-functionality, and/or low manufacturing cost. Semiconductor devices may encompass memory devices for storing data, logic devices for processing data, and hybrid devices for operating various functions simultaneously.

Semiconductor devices have high integration with the advanced development of the electronic industry. Semiconductor devices also have high speed with the advanced development of the electronic industry. Various studies have been conducted in an attempt to meet the requirements of high integration and/or high speed in semiconductor devices.

SUMMARY

The embodiments may be realized by providing a semiconductor device including a first buffer dielectric layer on a first dielectric layer; a second dielectric layer and a second buffer dielectric layer sequentially disposed on the first buffer dielectric layer, the second buffer dielectric layer being in contact with the first buffer dielectric layer; and a pad interconnection structure that penetrates the first buffer dielectric layer and the second buffer dielectric layer, wherein the pad interconnection structure includes copper and tin.

The embodiments may be realized by providing a semiconductor device including a first dielectric layer; a second dielectric layer on the first dielectric layer; and a pad connector between the first dielectric layer and the second dielectric layer, wherein the pad connector includes a central part and an outer part surrounding the central part, and wherein a grain size of the pad connector increases in a direction toward the central part from the outer part.

The embodiments may be realized by providing a semiconductor package including a package substrate; a first semiconductor chip on the package substrate, the first semiconductor chip including a first semiconductor layer and a first buffer dielectric layer stacked on a first surface of the first semiconductor layer; a second semiconductor chip on the first semiconductor chip, the second semiconductor chip including a second semiconductor layer and a second buffer dielectric layer stacked on a first surface of the second semiconductor layer, the second buffer dielectric layer being in contact with the first buffer dielectric layer; and a first pad interconnection structure that penetrates the first buffer dielectric layer and the second buffer dielectric layer, wherein the first pad interconnection structure includes copper and tin.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
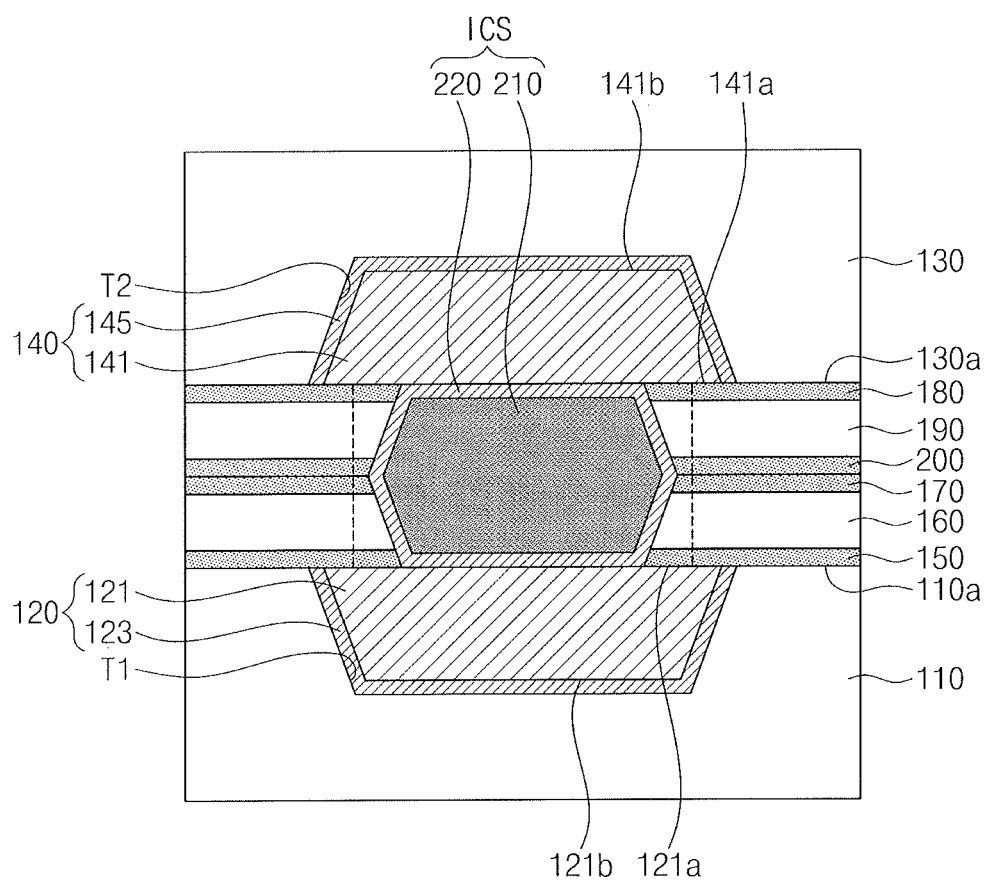
FIG. 1 illustrates a cross-sectional view of a semiconductor device according to some example embodiments.
Figure 2:
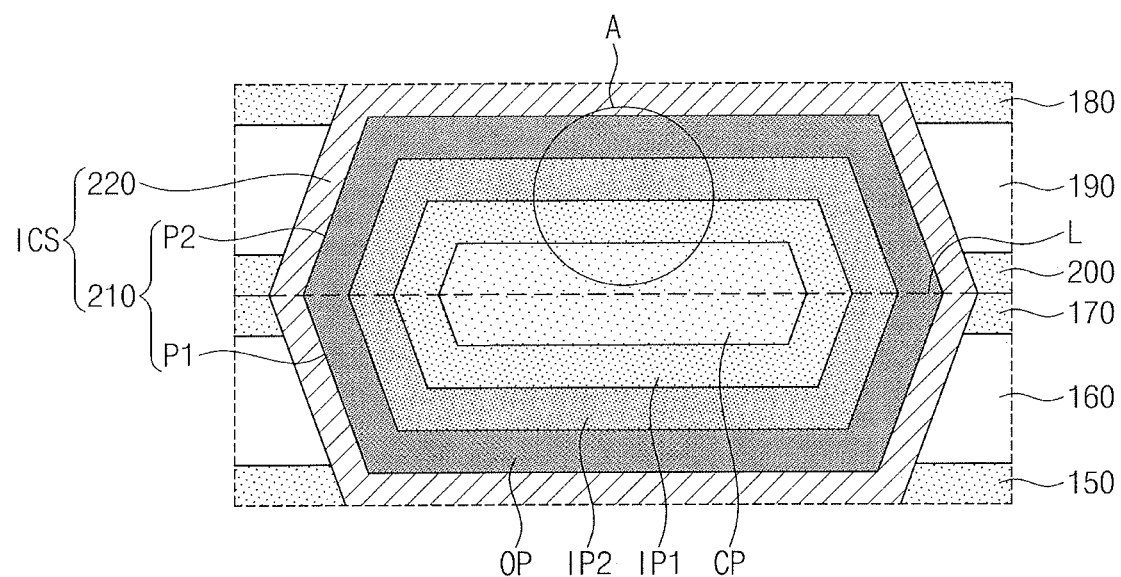
FIG. 2 illustrates an enlarged view showing a pad connector of FIG. 1.
Figure 3:
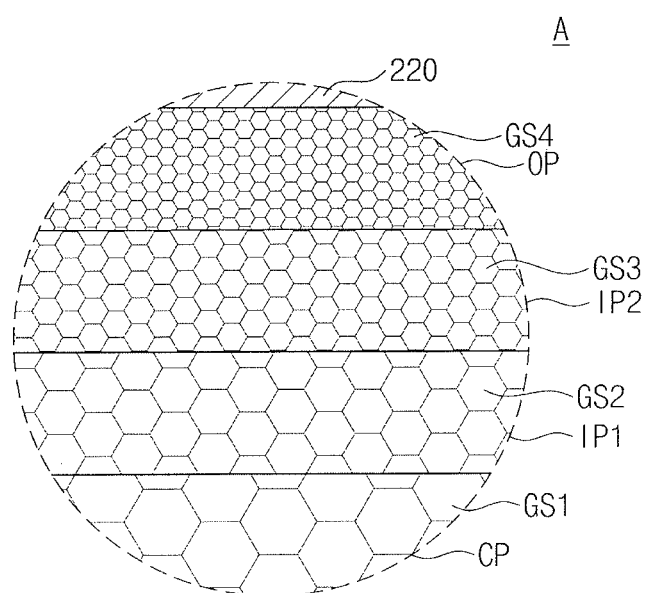
FIG. 3 illustrates an enlarged view showing section A of FIG. 2.

FIG. 1 illustrates a cross-sectional view of a semiconductor device according to some example embodiments. FIG. 2 illustrates an enlarged view showing a pad connector of FIG. 1. FIG. 3 illustrates an enlarged view showing section A of FIG. 2.

Referring to FIG. 1, a first pad 120 may be in a first trench T1 in a first dielectric layer 110. The first pad 120 may include a first metal pad 121 and a first metal barrier layer 123. The first metal pad 121 may be in the first trench T1, and in the first trench T1, the first metal barrier layer 123 may be between the first metal pad 121 and the first dielectric layer 110. The first metal pad 121 may have a first surface 121a and a second surface 121b facing each other (e.g., opposite to each other). The first surface 121a of the first metal pad 121 may be exposed at the first dielectric layer 110, and the second surface 121b and sidewalls of the first metal pad 121 may be in (e.g., may face) the first dielectric layer 110. The first surface 121a of the first metal pad 121 may be coplanar with one surface 110a of the first dielectric layer 110. The first metal barrier layer 123 may surround the sidewalls and the second surface 121b of the first metal pad 121. The first metal barrier layer 123 may expose the first surface 121a of the first metal pad 121 and the one surface 110a of the first dielectric layer 110. The first dielectric layer 110 may include, e.g., a PETOS layer or a silicon oxide layer. The first metal pad 121 may include, e.g., copper (Cu), aluminum (Al), nickel (Ni), or tungsten (W). The first metal barrier layer 123 may include, e.g., titanium or tantalum.

A second dielectric layer 130 may be on the first dielectric layer 110. A second pad 140 may be in a second trench T2 in the second dielectric layer 130. The second pad 140 may include a second metal pad 141 and a second metal barrier layer 145. The second metal pad 141 may be in the second trench T2, and in the second trench T2, the second metal barrier layer 145 may be between the second metal pad 141 and the second dielectric layer 130. The second metal pad 141 may have a first surface 141a and a second surface 141b facing each other. The first surface 141a of the second metal pad 141 may be exposed at the second dielectric layer 130, and the second surface 141b and sidewalls of the second metal pad 41 may be in or may face the second dielectric layer 130. The first surface 141a of the second metal pad 141 may be coplanar with one surface 130a of the second dielectric layer 130. The second metal barrier layer 145 may surround the sidewalls and the second surface 141b of the second metal pad 141. The second metal barrier layer 145 may expose the first surface 141a of the second metal pad 141 and the one surface 130a of the second dielectric layer 130. The second dielectric layer 130 may include, e.g., a PETOS layer or a silicon oxide layer. The second metal pad 141 may include, e.g., copper (Cu), aluminum (Al), nickel (Ni), or tungsten (W). The second metal barrier layer 145 may include, e.g., titanium or tantalum.

A first buffer dielectric layer 150, a third dielectric layer 160, and a second buffer dielectric layer 170 may be sequentially disposed on the one surface 110a of the first dielectric layer 110. The first buffer dielectric layer 150 may cover (e.g., a part of) the first surface 121a of the first metal pad 121, which first surface 121a is exposed by the first dielectric layer 110. The first buffer dielectric layer 150 may include, e.g., a silicon nitride layer or a silicon carbonitride layer. The third dielectric layer 160 may be on the first buffer dielectric layer 150. The third dielectric layer 160 may cover one surface of the first buffer dielectric layer 150. The third dielectric layer 160 may include, e.g., a PETOS layer or a silicon oxide layer. The second buffer dielectric layer 170 may be on the third dielectric layer 160. The second buffer dielectric layer 170 may include, e.g., a silicon nitride layer or a silicon carbonitride layer.

A third buffer dielectric layer 180, a fourth dielectric layer 190, and a fourth buffer dielectric layer 200 may be sequentially disposed (e.g., downwardly in FIG. 1) on the one surface 130a of the second dielectric layer 130. The third buffer dielectric layer 180 may cover (e.g., a part of) the first surface 141a of the second metal pad 141, which first surface 141a is exposed by the second dielectric layer 130. The third buffer dielectric layer 180 may include, e.g., a silicon nitride layer or a silicon carbonitride layer. The fourth dielectric layer 190 may be on the third buffer dielectric layer 180. The fourth dielectric layer 190 may cover one surface of the third buffer dielectric layer 180. The fourth dielectric layer 190 may include, e.g., a PETOS layer or a silicon oxide layer. The fourth buffer dielectric layer 200 may be on the fourth dielectric layer 190. The fourth buffer dielectric layer 200 and the second buffer dielectric layer 170 may be in contact with each other. The fourth buffer dielectric layer 200 may include, e.g., a silicon nitride layer or a silicon carbonitride layer.

An interconnection structure ICS may be between the first dielectric layer 110 and the second dielectric layer 130. For example, the interconnection structure ICS may be between the first pad 120 in the first dielectric layer 110 and the second pad 140 in the second dielectric layer 130. The interconnection structure ICS may penetrate the first buffer dielectric layer 150, the third dielectric layer 160, the second buffer dielectric layer 170, the third buffer dielectric layer 180, the fourth dielectric layer 190, and the fourth buffer dielectric layer 200. The interconnection structure ICS may be in contact with the first surface 121a of the first metal pad 121 and with the first surface 141a of the second metal pad 141. The first pad 120 and the second pad 140 may be electrically connected to each other through the interconnection structure ICS. The interconnection structure ICS may have, e.g., a regular hexagonal shape or a rectangular shape (in cross section).

The interconnection structure ICS may include a pad connector 210 and a connection metal barrier layer 220. The connection metal barrier layer 220 may surround the pad connector 210. The connection metal barrier layer 220 may contact the first metal pad 121 and the second metal pad 141. The connection metal barrier layer 220 may include, e.g., titanium or tantalum. The connection metal barrier layer 220 may serve as a diffusion break layer. Referring together to FIGS. 1 and 2, the pad connector 210 may include a first segment P1 and a second segment P2. The first segment P1 may penetrate the third dielectric layer 160 and the second buffer dielectric layer 170, and the second segment P2 may penetrate the fourth dielectric layer 190 and the fourth buffer dielectric layer 200. For example, the first segment P1 and the second segment P2 may be linearly symmetrical with respect to a symmetrical line L. The pad connector 210 may include, e.g., copper (Cu) and/or tin (Sn). For example, the pad connector 210 may have a lattice structure in which FCC (face-centered cubic) and tetragonal structures are mixed with each other. In an implementation, the pad connector 210 may have a lattice structure in which FCC (face-centered cubic) and diamond cubic structures are mixed with each other.

The pad connector 210 may include a central part CP, a first intermediate part IP1 surrounding the central part CP, a second intermediate part IP2 surrounding the first intermediate part IP1, and an outer part OP surrounding the second intermediate part IP2. The outer part OP may be surrounded by the connection metal barrier layer 220. In an implementation, an amount of copper (e.g., copper content) in the pad connector 210 may increase as or in a direction to, approaching, or toward the central part CP from the outer part OP, and an amount of tin (e.g., tin content) in the pad connector 210 may decrease as or in a direction to, approaching, or toward the central part CP from the outer part OP. For example, the outer part OP of the pad connector 210 may include copper, and the central part CP of the pad connector 210 may include tin. In an implementation, the copper content in the central part CP may be greater than the tin content in the central part CP. The copper content in the first intermediate part IP1 may be greater than the tin content in the first intermediate part IP1 but less than the copper content in the central part CP, and the tin content in the first intermediate part IP1 may be greater than the tin content in the central part CP. The first intermediate part IP1 may be or include, e.g., $Cu_3Sn$. The tin content in the second intermediate part IP2 may be greater than the copper content in the second intermediate part IP2 and the copper content in the second intermediate part IP2 may be less than the copper content in the first intermediate part IP1, and the tin content in the second intermediate part IP2 may be greater than the tin content in the first intermediate part IP1. The second intermediate part IP2 may be or include, e.g., $Cu_6Sn_5$. The tin content in the outer part OP may be greater than the copper content in the outer part OP and the copper content in the outer part OP may be less than the copper content in the second intermediate part IP2, and the tin content in the outer part OP may be greater than the tin content in the second intermediate part IP2.

In an implementation, as shown in FIG. 3, the pad connector 210 may have a grain size that increases as or in a direction approaching the central part CP from the outer part OP. For example, the central part CP may have a grain size GS1 that is greater than a grain size GS2 of the first intermediate part IP1 (GS1>GS2), and the grain size GS2 of the first intermediate part IP1 may be greater than a grain size GS3 of the second intermediate part IP2 (GS2>GS3). The grain size GS3 of the second intermediate part IP2 may be greater than a grain size GS4 of the outer part OP (GS3>GS4). For example, the grain size GS4 of the outer part OP may be smaller than all the other grain sizes GS1, GS2, and GS3 of the central, first intermediate, and second intermediate parts CP, IP1, and IP2. The grain size GS1 of the central part CP may be larger than all the other grain sizes GS2, GS3, and GS4 of the first intermediate, second intermediate, and central parts IP1, IP2, and CP.

Figure 4:
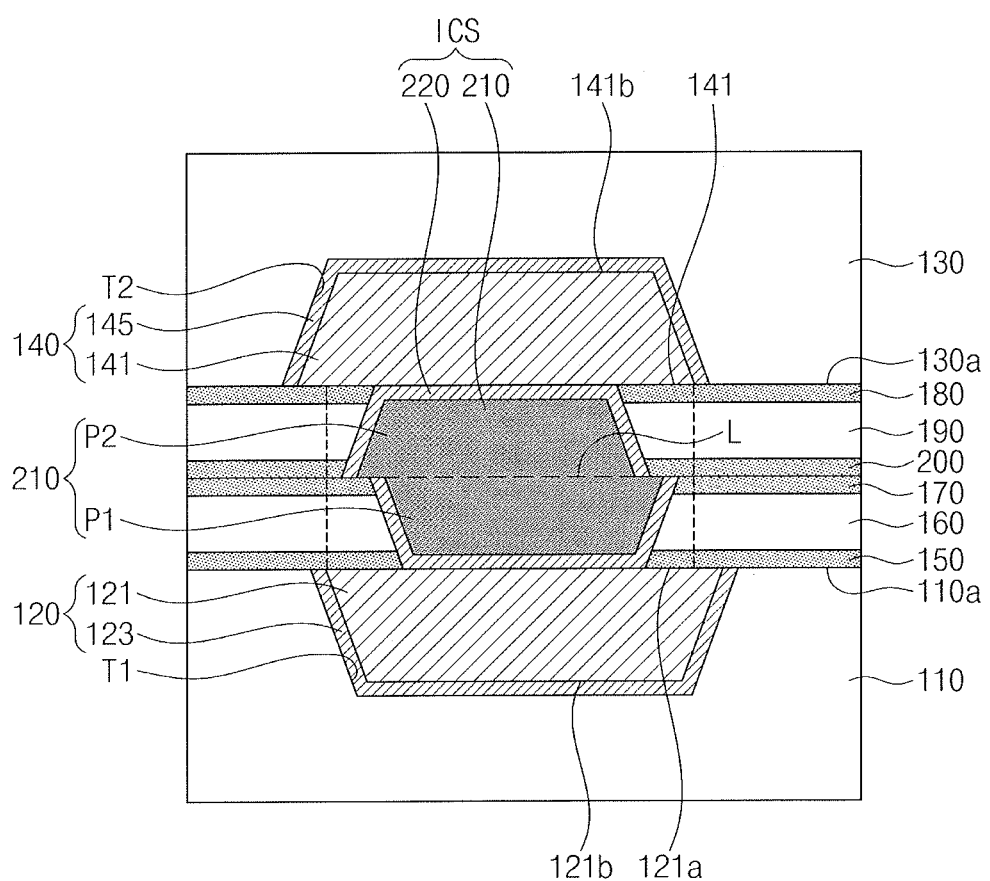
FIG. 4 illustrates a cross-sectional view showing a semiconductor device according to some example embodiments.
Figure 5:
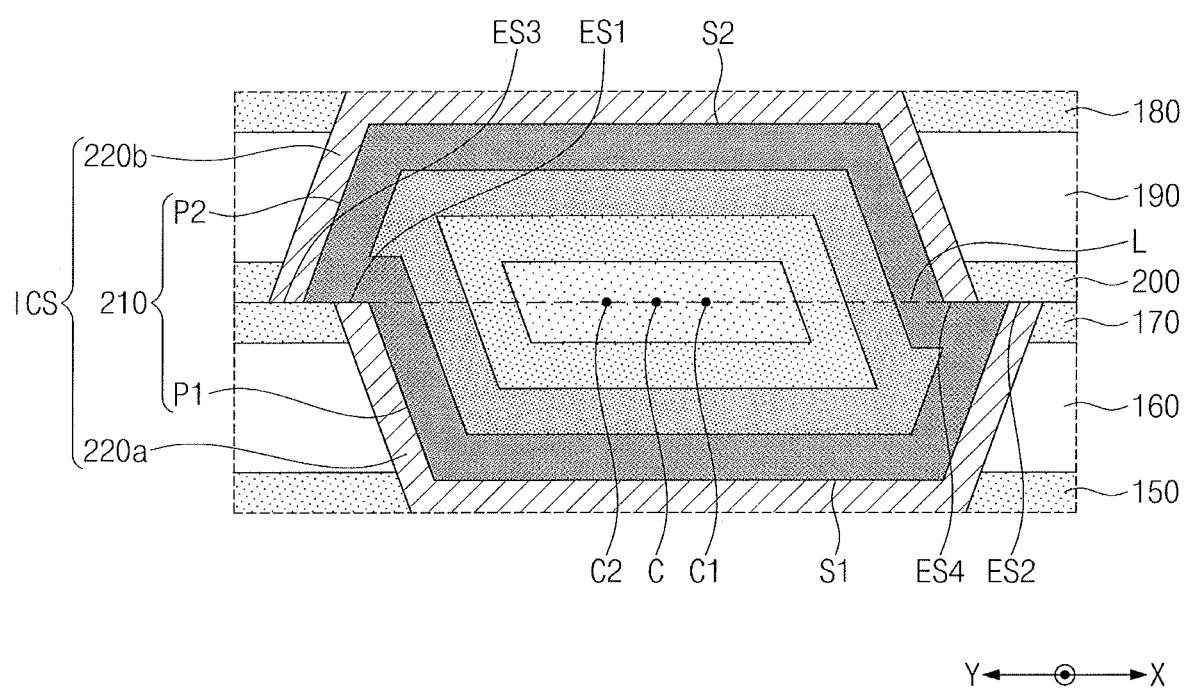
FIG. 5 illustrates an enlarged view showing a pad connector of FIG. 4.

FIG. 4 illustrates a cross-sectional view showing a semiconductor device according to some example embodiments. FIG. 5 illustrates an enlarged view showing a pad connector of FIG. 4. For brevity of description, those components substantially the same as those of the semiconductor device discussed above are allocated the same reference numerals thereto, and a repeated detailed explanation thereof may be omitted.

Referring together to FIGS. 4 and 5, the first part P1 and the second part P2 of the pad connector 210 may shift in opposite directions to each other. For example, the first part P1 may shift in a first direction X, and the second part P2 may shift in a second direction Y (that is opposite to the first direction X). For example, a central point C1 of the first segment P1 may move a certain distance in the first direction X from a central point C of the pad connector 210, and a central point C2 of the second segment P2 may move a certain distance in the second direction Y from the central point C of the pad connector 210, which central points C1 and C2 are positioned on the symmetrical line L of the pad connector 210. The central point C of the pad connector 210 may be at a central point C2 between the central point C1 of the first segment P1 and the central point C2 of the second segment P2. For example, the first part P1 of the pad connector 210 may be arranged in an offset alignment relative to the second part P2 of the pad connector 210 prior to having the first part P1 and the second part P2 of the pad connector 210 come into contact.

A first connection metal barrier layer 220a may surround one surface S1 and sidewalls of the first segment P1. The first connection metal barrier layer 220a may have, at its one end, one surface ES1 that is coplanar with one surface of the second buffer dielectric layer 170, and also have, at its other end, another surface ES2 that is coplanar with the one surface of the second buffer dielectric layer 170, which one surface ES1 may contact the second segment P2 and which other surface ES2 may contact the fourth buffer dielectric layer 200. A second connection metal barrier layer 220b may surround one surface S2 and sidewalls of the second segment P2. The second connection metal barrier layer 220b may have, at its one end, one surface ES3 that is coplanar with one surface of the fourth buffer dielectric layer 200, and also have, at its other end, another surface ES4 that is coplanar with the one surface of the fourth buffer dielectric layer 200, which one surface ES3 may contact the second buffer dielectric layer 170 and which other surface ES4 may contact the first segment P1.

Figure 6:
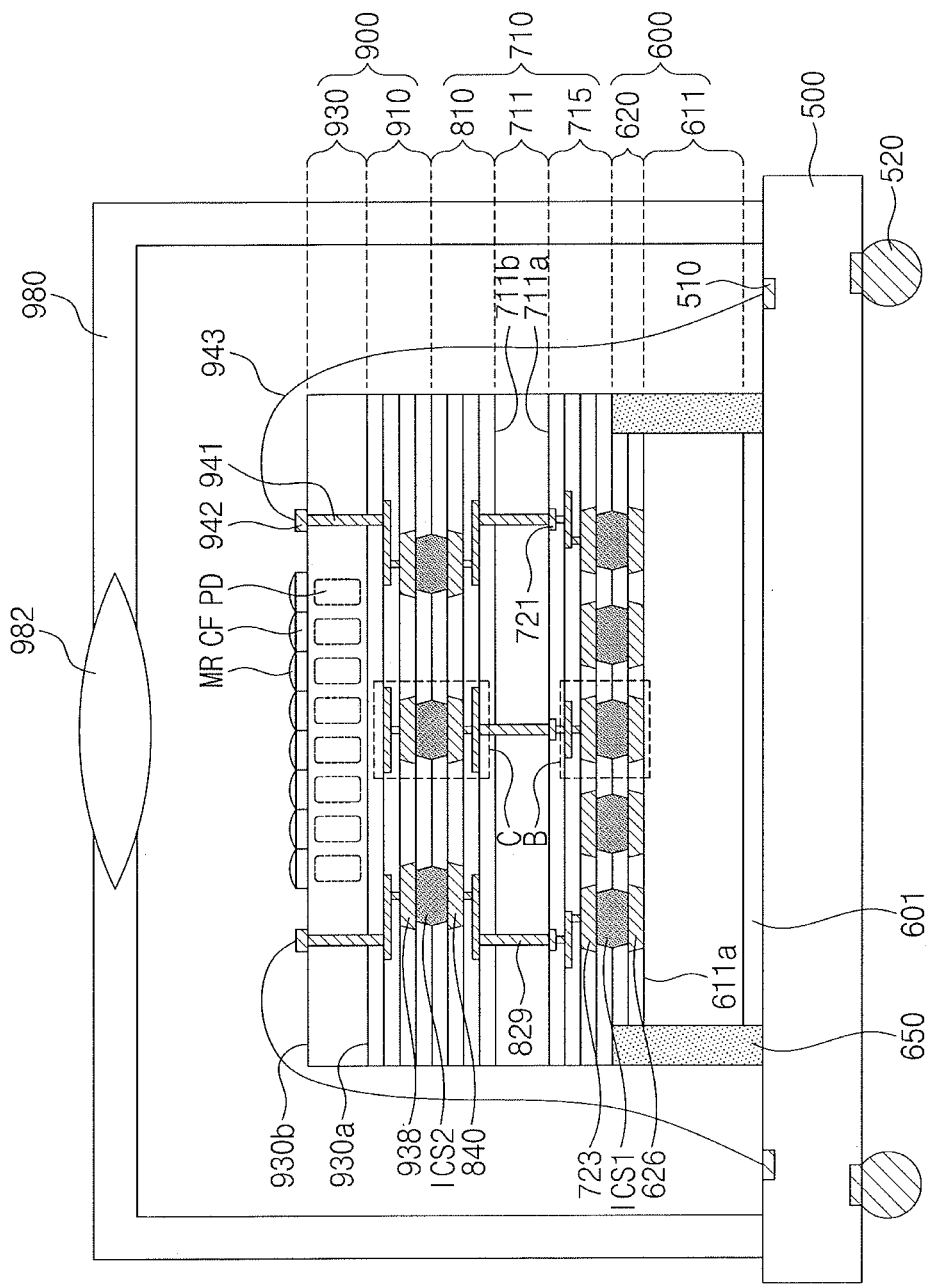
FIG. 6 illustrates a cross-sectional view showing a semiconductor package according to some example embodiments.
Figure 7:
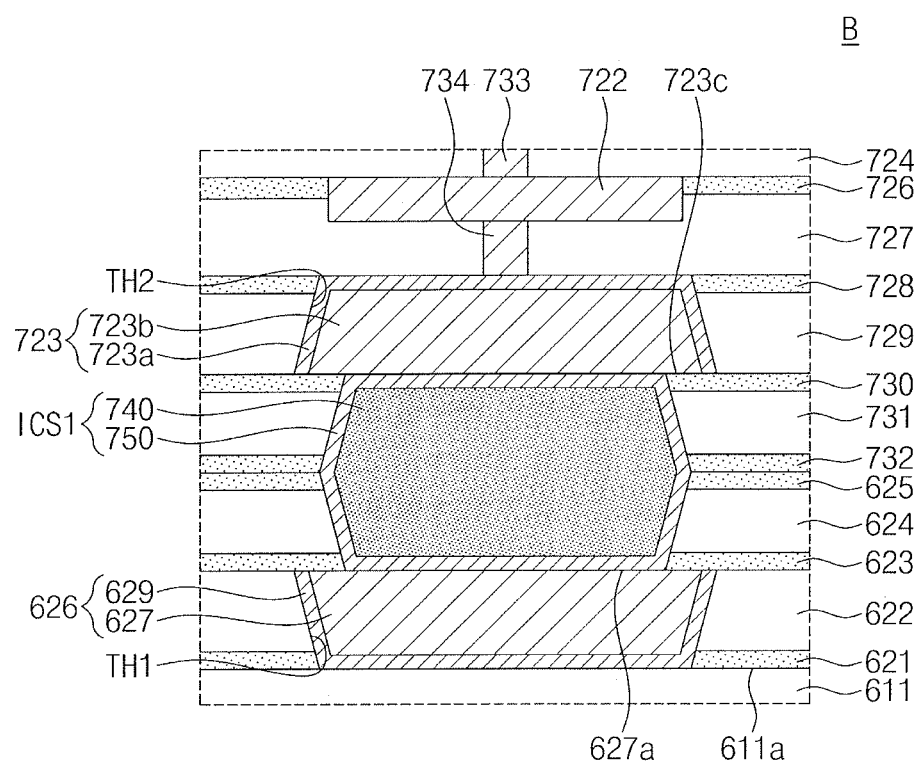
FIG. 7 illustrates an enlarged view showing section B of FIG. 6.
Figure 8:
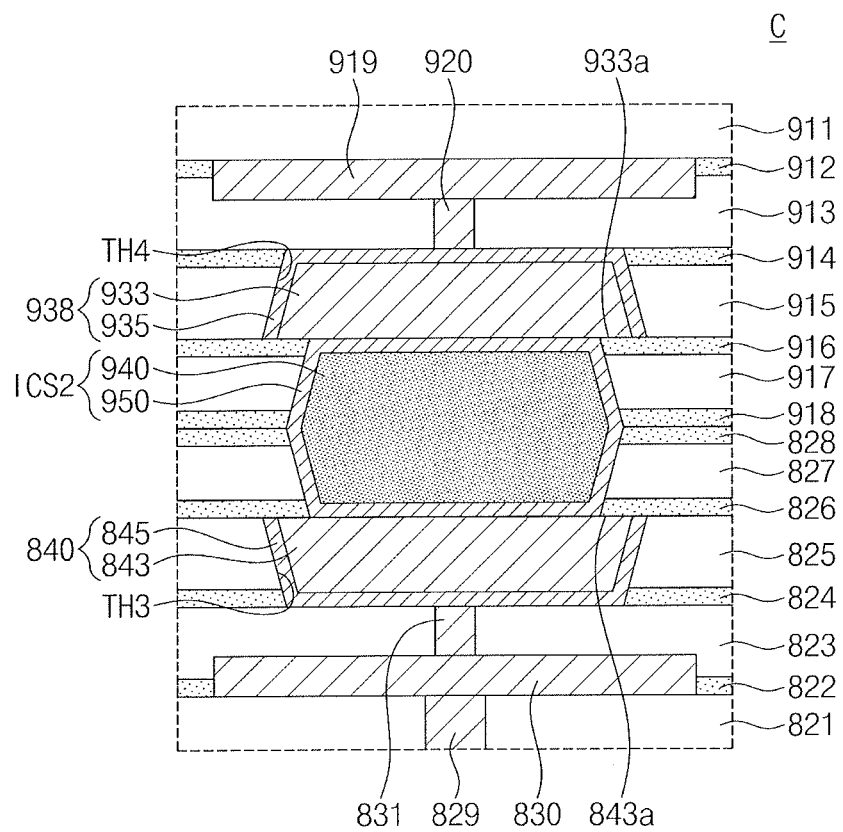
FIG. 8 illustrates an enlarged view showing section C of FIG. 6.

FIG. 6 illustrates a cross-sectional view showing a semiconductor package according to some example embodiments. FIG. 7 illustrates an enlarged view showing section B of FIG. 6. FIG. 8 illustrates an enlarged view showing section C of FIG. 6.

Referring to FIG. 6, a first semiconductor chip 600 may be on a package substrate 500. The package substrate 500 may include first bonding pads 510 and bumps 520. The first bonding pads 510 may be on a top surface of the package substrate 500. The first bonding pads 510 may include, e.g., a conductive material. The bumps 520 may be on a bottom surface of the package substrate 500, which bottom surface faces the top surface of the package substrate 500. The bumps 520 may be electrically connected to the first bonding pads 510. The bumps 520 may include, e.g., solder balls or pillars.

The first semiconductor chip 600 may be attached through an adhesive layer 601 to the top surface of the package substrate 500. The adhesive layer 601 may be between the first semiconductor chip 600 and the package substrate 500. The adhesive layer 601 may include, e.g., a dielectric polymer. The first semiconductor chip 600 may be, e.g., a memory chip such as DRAM, SRAM, MRAM, or Flash memory. The first semiconductor chip 600 may include a first semiconductor layer 611 and a first connection line structure 620. The first semiconductor layer 611 may include a semiconductor material. The first semiconductor layer 611 may be provided on its first surface 611a with portions of transistors (e.g., gate electrodes) and/or passive devices.

The first connection line structure 620 may be on the first surface 611a of the first semiconductor layer 611. Referring together to FIGS. 6 and 7, the first connection line structure 620 may include a first buffer dielectric layer 621, a first interlayer dielectric layer 622, a second buffer dielectric layer 623, a second interlayer dielectric layer 624, a third buffer dielectric layer 625, and first pads 626. The first buffer dielectric layer 621 may be on the first surface 611a of the first semiconductor layer 611. The first buffer dielectric layer 621 may include, e.g., a silicon nitride layer or a silicon carbonitride layer. The first interlayer dielectric layer 622 may be on a top surface of the first buffer dielectric layer 621. The first interlayer dielectric layer 622 may include, e.g., a PETOS layer or a silicon oxide layer. The second buffer dielectric layer 623 may be on a top surface of the first interlayer dielectric layer 622. The second buffer dielectric layer 623 may include, e.g., a silicon nitride layer or a silicon carbonitride layer. The second interlayer dielectric layer 624 may be on a top surface of the second buffer dielectric layer 623. The second interlayer dielectric layer 624 may include, e.g., a PETOS layer or a silicon oxide layer. The third buffer dielectric layer 625 may be on a top surface of the second interlayer dielectric layer 624. The third buffer dielectric layer 625 may include, e.g., a silicon nitride layer or a silicon carbonitride layer.

The first pads 626 may be in the first buffer dielectric layer 621 and the first interlayer dielectric layer 622. For example, each of the first pads 626 may be in a first trench TH1 that penetrates the first buffer dielectric layer 621 and the first interlayer dielectric layer 622. The first pad 626 may include a first metal pad 627 and a first metal barrier layer 629. The first metal barrier layer 629 may be on a bottom surface and sidewalls of the first trench TH1. The first metal barrier layer 629 may contact the first surface 611a of the first semiconductor layer 611. The first metal pad 627 may be in the first trench TH1. The first metal pad 627 may have a first surface 627a that is coplanar with the top surface of the first interlayer dielectric layer 622. The first metal barrier layer 629 may surround the sidewalls and a second surface of the first metal pad 627, which second surface faces the first surface 627a. The first metal barrier layer 629 may include, e.g., titanium (Ti) or tantalum (Ta). The first metal pad 627 may include, e.g., copper (Cu), aluminum (Al), nickel (Ni), or tungsten (W).

A second semiconductor chip 710 may be on the first connection line structure 620. The second semiconductor chip 710 may include a second semiconductor layer 711, a second connection line structure 715, and a third connection line structure 810. The second connection line structure 715 may be between the second semiconductor layer 711 and the first connection line structure 620. The second semiconductor layer 711 may include, e.g., a semiconductor material. The second connection line structure 715 may be on a first surface 711a of the second semiconductor layer 711. The second connection line structure 715 may include a second pad 721, a third pad 722, fourth pads 723, a fourth interlayer dielectric layer 724, a third buffer dielectric layer 726, a fifth interlayer dielectric layer 727, a fourth buffer dielectric layer 728, a sixth interlayer dielectric layer 729, a fifth buffer dielectric layer 730, a seventh interlayer dielectric layer 731, a sixth buffer dielectric layer 732, first vias 733, and second vias 734. The second semiconductor layer 711 may be sequentially provided on its first surface 711a with the fourth interlayer dielectric layer 724, the third buffer dielectric layer 726, the fifth interlayer dielectric layer 727, the fourth buffer dielectric layer 728, the sixth interlayer dielectric layer 729, the fifth buffer dielectric layer 730, the seventh interlayer dielectric layer 731, and the sixth buffer dielectric layer 732. The sixth buffer dielectric layer 732 may contact the third buffer dielectric layer 625. The third, fourth, fifth, and sixth buffer dielectric layers 726, 728, 730, and 732 may include, e.g., a silicon nitride layer or a silicon carbonitride layer. The fourth, fifth, sixth, and seventh interlayer dielectric layers 724, 727, 729, and 731 may include, e.g., a silicon oxide layer or a PETEOS layer.

The second pad 721 may be on the first surface 711a of the second semiconductor layer 711. The second pad 721 may be covered with the fourth interlayer dielectric layer 724. The second pad 721 may include; e.g., copper (Cu), aluminum (Al), nickel (Ni), tungsten (W), titanium (Ti), or tantalum (Ta). The first vias 733 may be in the fourth interlayer dielectric layer 724. The first via 733 may contact the second pad 721. The first vias 733 may include, e.g., copper (Cu), aluminum (Al), nickel (Ni), tungsten (W), titanium (Ti), or tantalum (Ta). The third pads 722 may be in the fifth interlayer dielectric layer 727. The third pads 722 may contact the first vias 733. The third pads 722 may include, e.g., copper (Cu), aluminum (Al), nickel (Ni), tungsten (W), titanium (Ti), or tantalum (Ta). The second vias 734 may be in the fifth interlayer dielectric layer 727. The second via 734 may contact the third pad 722. The second vias 734 may include, e.g., copper (Cu), aluminum (Al), nickel (Ni), tungsten (W), titanium (Ti), or tantalum (Ta).

The fourth pads 723 may be in the fourth buffer dielectric layer 728 and the sixth interlayer dielectric layer 729. For example, each of the fourth pads 723 may be in a second trench TH2 that penetrates the fourth buffer dielectric layer 728 and the sixth interlayer dielectric layer 729. The fourth pad 723 may include a second metal barrier layer 723a and a second metal pad 723b. The second metal barrier layer 723a may be on a bottom surface (upward or top surface as shown in FIG. 7) and sidewalls of the second trench TH2. The second metal barrier layer 723a may contact the second via 734. The second metal pad 723b may cover a top or inner surface of the second metal barrier layer 723a and may lie in the second trench TH2. The second metal pad 723b may have a first surface 723c that is coplanar with one surface of the sixth interlayer dielectric layer 729. The second metal barrier layer 723a may surround sidewalls and a second surface of the second metal pad 723b, which second surface faces the first surface 723c. The second metal barrier layer 723a may include, e.g., titanium (Ti) or tantalum (Ta). The second metal pad 723b may include, e.g., copper (Cu), aluminum (Al), nickel (Ni), or tungsten (W).

First connection structures ICS1 may be in the first connection line structure 620 and the second connection line structure 715. For example, each of the first connection structures ICS1 may be between the first pad 626 and the fourth pad 723. The first interconnection structure ICS1 may be in contact with the first surface 627a of the first metal pad 627 and with the first surface 723c of the second metal pad 723b. The first interconnection structure ICS1 may penetrate the fifth buffer dielectric layer 730, the seventh dielectric layer 731, the sixth buffer dielectric layer 732, the second buffer dielectric layer 623, the second interlayer dielectric layer 624, and the third buffer dielectric layer 625. The first interconnection structure ICS1 may include a first pad connector 740 and a first connection metal barrier layer 750. The first connection metal barrier layer 750 may surround the first pad connector 740. The first pad connector 740 may correspond to the pad connector 210 shown in FIGS. 1 and 2, and the first connection metal barrier layer 750 may correspond to the connection metal barrier layer 220 shown in FIGS. 1 and 2. The first pad connector 740 may include, e.g., copper (Cu) and tin (Sn). The first connection metal barrier layer 750 may include, e.g., titanium or tantalum.

A molding layer 650 may be on the package substrate 500. The molding layer 650 may cover sidewalls of the first semiconductor layer 611, sidewalls of the adhesive layer 601, and sidewalls of the first connection line structure 620. The molding layer 650 may contact one surface of the second connection line structure 715. For example, the molding layer 650 may contact the sixth buffer dielectric layer 732 of the second connection line structure 715. The molding layer 650 may include a dielectric polymer such as epoxy molding compound.

Referring together to FIGS. 6, 7, and 8, the third connection line structure 810 may be on a second surface 711b of the second semiconductor layer 711. The second surface 711b of the second semiconductor layer 711 may face the first surface 711a of the second semiconductor layer 711. Integrated devices may be on the second surface 711b of the second semiconductor layer 711. For example, a gate electrode of a transistor may be on the second surface 711b of the second semiconductor layer 711. The gate electrode of the transistor may be covered with the third connection line structure 810.

The third connection line structure 810 may include eighth to eleventh interlayer dielectric layers 821, 823, 825, and 827, seventh to tenth buffer dielectric layers 822, 824, 826, and 828, a first through via 829, a third via 831, and fifth and sixth pads 830 and 840. The second semiconductor layer 711 may be sequentially provided on its second surface 711b with the eight interlayer dielectric layer 821, the seventh buffer dielectric layer 822, the eighth buffer dielectric layer 824, the tenth interlayer dielectric layer 825, the ninth buffer dielectric layer 826, the eleventh interlayer dielectric layer 827, and the tenth buffer dielectric layer 828. The eighth to eleventh interlayer dielectric layers 821, 823, 825, and 827 may include, e.g., a silicon oxide layer or a PETOS layer. The seventh to tenth buffer dielectric layers

822, 824, 826, and 828 may include, e.g., a silicon nitride layer or a silicon carbonitride layer.

The first through via 829 may penetrate the eighth interlayer dielectric layer 821 and the second semiconductor layer 711. The first through via 829 may connect the fifth pad 830 and the second pad 721 to each other. The first through via 829 may include, e.g., a conductive material. The fifth pad 830 may be in the ninth interlayer dielectric layer 823. The fifth pad 830 may penetrate the seventh buffer dielectric layer 822 and have connection with the first through via 829. The fifth pad 830 may include, e.g., copper (Cu), aluminum (Al), nickel (Ni), tungsten (W), titanium (Ti), or tantalum (Ta). The third vias 831 may be in the ninth interlayer dielectric layer 823. The third via 831 may contact the fifth pad 830. The third via 831 may include, e.g., copper (Cu), aluminum (Al), nickel (Ni), tungsten (W), titanium (Ti), or tantalum (Ta).

The sixth pads 840 may be in the sixth buffer dielectric layer 824 and the tenth interlayer dielectric layer 825. For example, each of the sixth pads 840 may be in a third trench TH3 that penetrates the eighth buffer dielectric layer 824 and the tenth interlayer dielectric layer 825. The sixth pad 840 may include a third metal pad 843 and a third metal barrier layer 845. The third metal barrier layer 845 may be on a bottom surface and sidewalls of the third trench TH3. The second metal barrier layer 723a may contact the third via 831. The third metal pad 843 may cover a top surface of the third metal barrier layer 845 and may lie in the third trench TH3. The third metal pad 843 may have a first surface 843a that is coplanar with one surface of the tenth interlayer dielectric layer 825. The third metal barrier layer 845 may surround sidewalls and a second surface of the third metal pad 843, which second surface faces the first surface 843a. The third metal barrier layer 845 may include, e.g., titanium (Ti) or tantalum (Ta). The third metal pad 843 may include, e.g., copper (Cu), aluminum (Al), nickel (Ni), or tungsten (W).

A third semiconductor chip 900 may be on the second semiconductor chip 710. The third semiconductor chip 900 may include a fourth connection line structure 910 and a third semiconductor layer 930. The third semiconductor chip 900 may be, e.g., an image sensor chip. The fourth connection line structure 910 may be between the third semiconductor layer 930 and the third connection line structure 810. The fourth connection line structure 910 may be on a first surface 930a of the third semiconductor layer 930. The fourth connection line structure 910 may include twelfth to fifteenth interlayer dielectric layers 911, 913, 915, and 917, eleventh to fourteenth buffer dielectric layers 912, 914, 916, and 918, a fourth via 920, and seventh and eighth pads 919 and 931. The third semiconductor layer 930 may be sequentially provided on its first surface 930a with the twelfth interlayer dielectric layer 911, the eleventh buffer dielectric layer 912, the thirteenth interlayer dielectric layer 913, the twelfth buffer dielectric layer 914, the fourteenth interlayer dielectric layer 915, the twelfth buffer dielectric layer 914, the fifteenth interlayer dielectric layer 917, and the fourteenth buffer dielectric layer 918. The fourteenth buffer dielectric layer 918 and the tenth buffer dielectric layer 828 may be in contact with each other. The twelfth to fifteenth interlayer dielectric layers 911, 913, 915, and 917 may include, e.g., a silicon oxide layer or a PETOS layer. The eleventh to fourteenth buffer dielectric layers 912, 914, 916, and 918 may include, e.g., a silicon nitride layer or a silicon carbonitride layer.

The seventh pads 919 may be in the thirteenth interlayer dielectric layer 913. The seventh pad 919 may penetrate the eleventh buffer dielectric layer 912 and have a connection or be connected with the fourth via 920. The seventh pad 919 may include, e.g., copper (Cu), aluminum (Al), nickel (Ni), tungsten (W), titanium (Ti), or tantalum (Ta). The fourth via 920 may be disposed in the thirteenth interlayer dielectric layer 913. The fourth via 920 may include, e.g., copper (Cu), aluminum (Al), nickel (Ni), tungsten (W), titanium (Ti), or tantalum (Ta). The eighth pads 938 may be in the twelfth buffer dielectric layer 914 and the fourteenth interlayer dielectric layer 915. For example, each of the eighth pads 938 may be in a fourth trench TH4 that penetrates the twelfth buffer dielectric layer 914 and the fourteenth interlayer dielectric layer 915. The eighth pad 938 may include a fourth metal pad 933 and a fourth metal barrier layer 935. The fourth metal barrier layer 935 may be on a bottom surface (e.g., upward or top surface in FIG. 8) and sidewalls of the fourth trench TH4. The fourth metal barrier layer 935 may contact the fourth via 920. The fourth metal pad 933 may cover a top surface of the fourth metal barrier layer 935 and may lie in the fourth trench TH4. The fourth metal pad 933 may have a first surface 933a that is coplanar with one surface of the fourteenth interlayer dielectric layer 915. The fourth metal barrier layer 935 may surround sidewalls and a second surface of the fourth metal pad 933, which second surface faces the first surface 933a. The fourth metal barrier layer 935 may include titanium (Ti) or tantalum (Ta). The fourth metal pad 933 may include, e.g., copper (Cu), aluminum (Al), nickel (Ni), or tungsten (W).

Second connection structures ICS2 may be in the third connection line structure 810 and the fourth connection line structure 910. For example, each of the second connection structures ICS2 may be between the sixth pad 840 and the eighth pad 938. The second interconnection structure ICS2 may be in contact with the first surface 843a of the third metal pad 843 and with the first surface 933a of the fourth metal pad 933. The second interconnection structure ICS2 may penetrate the thirteenth buffer dielectric layer 916, the fifteenth interlayer dielectric layer 917, the fourteenth buffer dielectric layer 918, the tenth buffer dielectric layer 828, the eleventh interlayer dielectric layer 827, and the ninth buffer dielectric layer 826. The second interconnection structure ICS2 may include a second pad connector 940 and a second connection metal barrier layer 950. The second connection metal barrier layer 950 may surround the second pad connector 940. The second pad connector 940 may correspond to the pad connector 210 shown in FIGS. 1 and 2, and the second connection metal barrier layer 950 may correspond to the connection metal barrier layer 220 shown in FIGS. 1 and 2. The second pad connector 940 may include, e.g., copper (Cu) and tin (Sn). The second connection metal barrier layer 950 may include, e.g., titanium or tantalum.

The third semiconductor layer 930 may be provided on its first surface 930a with portions of transistors. For example, gate electrodes of the transistors may be on the first surface 930a of the third semiconductor layer 930. Photoelectric conversion devices PD may be in the third semiconductor layer 930. The photoelectric conversion devices PD may have a different conductive type from that of the third semiconductor layer 930. The third semiconductor layer 930 may include a semiconductor material. A second through via 941 may be in the third semiconductor layer 930. The second through via 941 may penetrate the third semiconductor layer 930 and may be connected with the seventh pad 919. The second through via 941 may include, e.g., a conductive material. Color filters CF may be on a second surface 930b of the third semiconductor layer 930, which second surface 930b faces the first surface 930a. The color filters CF may correspond to the photoelectric conversion devices PD. Micro-lenses MR may be on the color filters CF. The micro-lenses MR may correspond to the color filters CF. Second bonding pads 942 may be on the second surface 930*b* of the third semiconductor layer 930. The second bonding pads 942 may be spaced apart at a certain interval around the third semiconductor layer 930. Bonding wires 943 may be between the first bonding pads 510 and the second bonding pads 942. The bonding wires 943 may electrically connect the third semiconductor chip 900 and the package substrate 500 to each other.

The package substrate 500 may be provided thereon with a holder 980 supporting a lens 982. The holder 980 may include an engineering plastic. The lens 982 may be on the holder 980, facing the third semiconductor chip 900. The lens 982 may include a transparent material such as glass, allowing light to pass therethrough.

FIGS. 9A to 9E illustrate cross-sectional views of stages in a method of fabricating a semiconductor device according to some example embodiments.

Figure 9A:
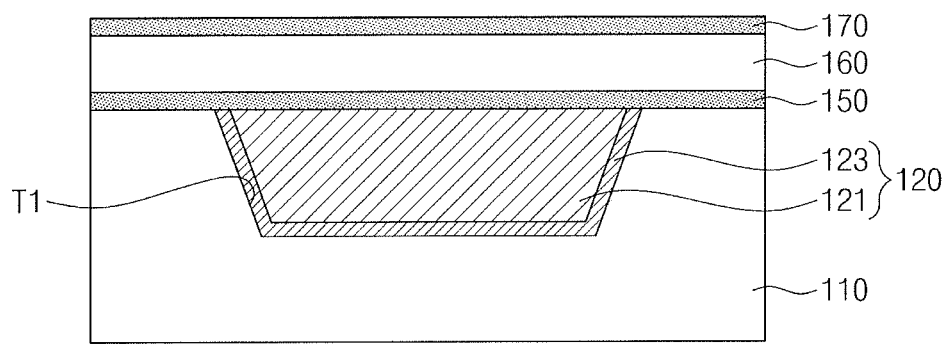
FIGS. 9A to 9E illustrate cross-sectional views of stages in a method of fabricating a semiconductor device according to some example embodiments.

Referring to FIG. 9A, a first pad 120 may be formed in a first dielectric layer 110. The formation of the first pad 120 may include forming a first trench T1 in the first dielectric layer 10, forming a first barrier layer to cover a top surface of the first dielectric layer 110 and also to cover a bottom surface and sidewalls of the first trench T, forming a first metal layer to cover the first barrier layer and to fill the first trench T, and performing a planarization process to grind the first metal layer and the first barrier layer to expose the top surface of the first dielectric layer 110. The first pad 120 may include a first metal barrier layer 123 and a first metal pad 121. The first metal barrier layer 123 may conformally cover the bottom surface and sidewalls (e.g., inner surfaces) of the first trench T1. The first metal pad 121 may completely fill (e.g., remaining portions of) the first trench T1.

A first buffer dielectric layer 150, a third dielectric layer 160, and a second buffer dielectric layer 170 may be sequentially formed on the first dielectric layer 110. The first buffer dielectric layer 150 may cover the top surface of the first dielectric layer 110 and a top surface of the first pad 120. The third dielectric layer 160 may cover a top surface of the first buffer dielectric layer 150, and the second buffer dielectric layer 170 may cover a top surface of the third dielectric layer 160.

Figure 9B:
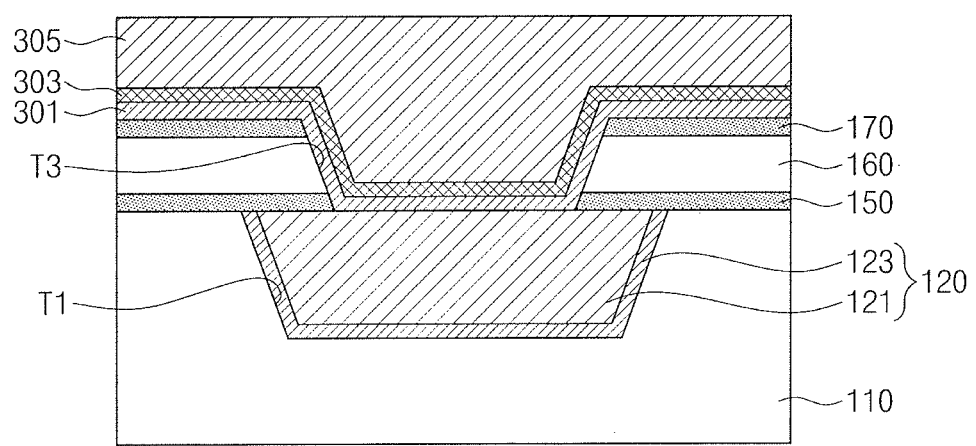

Referring to FIG. 9B, a third trench T3 may be formed in the first buffer dielectric layer 150, the third dielectric layer 160, and the second buffer dielectric layer 170. The third trench T3 may be formed by patterning the second buffer dielectric layer 170, the third dielectric layer 160, and the first buffer dielectric layer 150 in order to expose the top surface of the first pad 120. The third trench T3 may have a width less than that of the first trench T1.

A second barrier layer 301, a second metal layer 303, and a third metal layer 305 may be formed in the third trench T3. The second barrier layer 301 may conformally cover a top surface of the second buffer dielectric layer 170, and also conformally cover a bottom surface and sidewalls of the third trench T3. The second metal layer 303 may conformally cover a top surface of the second barrier layer 301. The third metal layer 305 may cover the second metal layer 303 and may fill the third trench T3. A plating process may be performed to form the second metal layer 303 and the third metal layer 305. The second barrier layer 301 may include, e.g., titanium or tantalum. The second metal layer 303 may include, e.g., tin (Sn). The third metal layer 305 may include, e.g., copper (Cu), aluminum (Al), nickel (Ni), or tungsten (W).

Figure 9C:
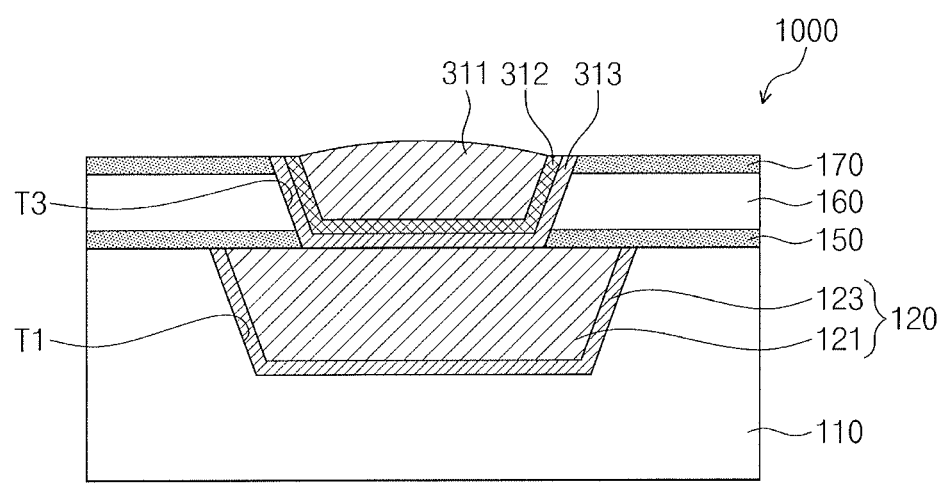

Referring to FIG. 9C, the third metal layer 305 may be etched to form a first bonding metal pad 311. The first bonding metal pad 311 may be formed by a planarization process performed on the third metal layer 305, in which planarization process the third metal layer 305 is etched to expose a top surface of the second metal layer 303. The second metal layer 303 may serve as an etch stop layer. The planarization process may include a chemical mechanical polishing process or a wet etching process. When a wet etching process is performed as the planarization process, hydrofluoric acid (HF) may be used.

The second metal layer 303 may be ground to form a second bonding metal pad 312. The second bonding metal pad 312 may be formed by grinding the second metal layer 303 so as to expose the top surface of the second barrier layer 301. When an abrasive is used to grind the second metal layer 303, the abrasive may have an etch selectivity with respect to the first bonding metal pad 311. The first bonding metal pad 311 may be etched on its edge top surface adjacent to the second bonding metal pad 312, and may not be etched on its central top surface far away from the second bonding metal pad 312. Therefore, the first bonding metal pad 311 may have a convexly curved surface. For example, a chemical mechanical polishing process may be performed to grind the second metal layer 303.

The second barrier layer 301 may be ground to form a first connection barrier layer 313. The first connection barrier layer 313 may be formed by grinding the second barrier layer 301 so as to expose the top surface of the second buffer dielectric layer 170. When an abrasive is used to grind the second barrier layer 301, the abrasive may have an etch selectivity with respect to the first bonding metal pad 311 and the second bonding metal pad 312. For example, a chemical mechanical polishing process may be performed to grind the second barrier layer 301. The first connection barrier layer 313 may contact a top surface of the first metal pad 121. The formation of the first connection barrier layer 313 may obtain a first pad structure 1000.

Figure 9D:
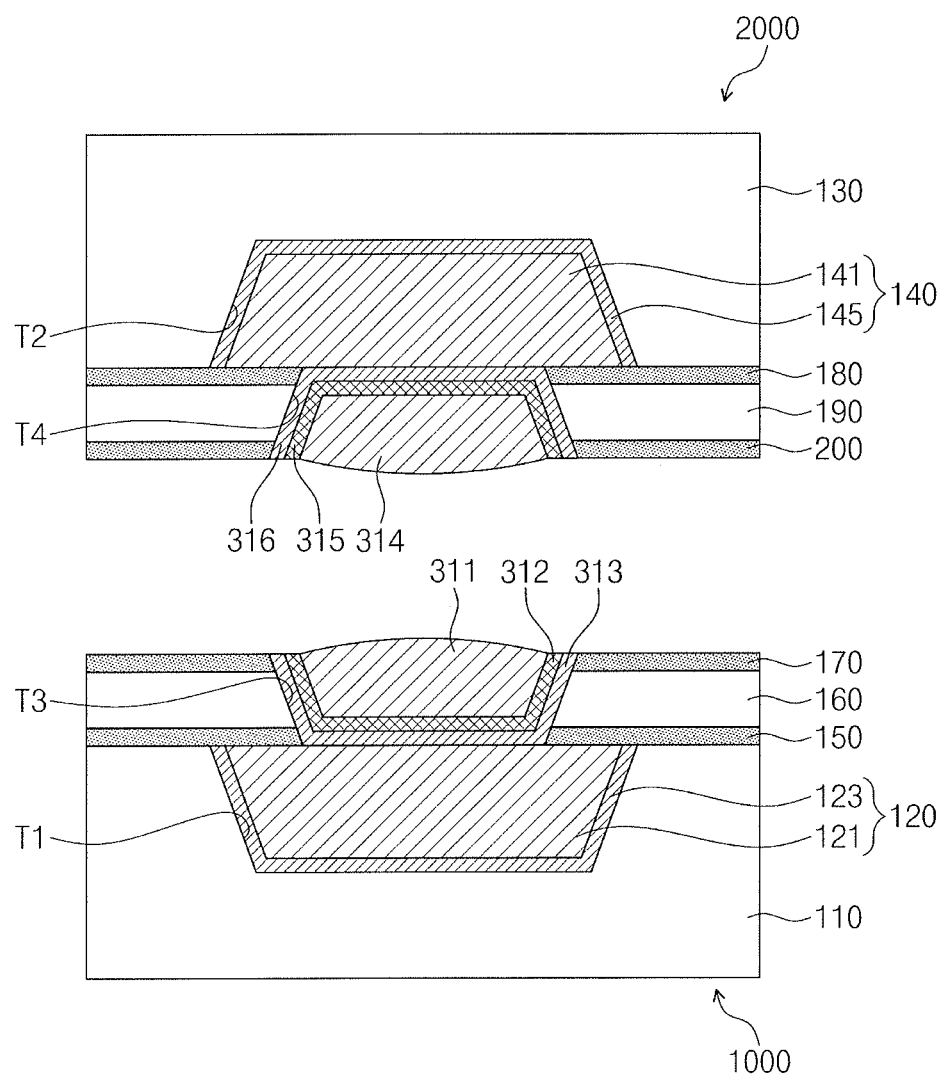

Referring to FIG. 9D, the same process as those discussed above may be performed to form a second pad structure 2000. A second trench T2 may be formed in a second dielectric layer 130, and a second metal barrier layer 145 and a second metal pad 141 may be formed in the second trench T2. The second metal barrier layer 145 may conformally cover a bottom surface and sidewalls of the second trench T2. The second metal pad 141 may cover the second metal barrier layer 145 and may fill the second trench T2. A third buffer dielectric layer 180, a fourth dielectric layer 190, and a fourth buffer dielectric layer 200 may be sequentially formed on a top surface of the second dielectric layer 130. A fourth trench T4 may be formed by patterning the fourth buffer dielectric layer 200, the fourth dielectric layer 190, and the third buffer dielectric layer 180. The fourth trench T4 may expose a top surface of the second metal pad 141. The fourth trench T4 may be formed to have a width less than that of the second trench T2.

A first connection barrier layer 316, a fourth bonding metal pad 315, and a third bonding metal pad 314 may be sequentially formed in the fourth trench T4. The first connection barrier layer 316 may conformally cover a bottom surface and sidewalls of the fourth trench T4. The first connection barrier layer 316 may contact the top surface of the second metal pad 141. The first connection barrier layer 316 may expose a top surface of the fourth buffer dielectric layer 200. The first connection barrier layer 316 may include. e.g., titanium or tantalum. The fourth bonding metal pad 315 may conformally cover a top surface of the first connection barrier layer 316. The fourth bonding metal pad 315 may expose the top surface of the fourth buffer dielectric layer 200. The fourth bonding metal pad 315 may include, e.g., tin (Sn). The third bonding metal pad 314 may cover a top surface of the fourth bonding metal pad 315 and may fill the fourth trench T4. The third bonding metal pad 314 may expose the top surface of the fourth buffer dielectric layer 200. The third bonding metal pad 314 may have a convexly curved top surface. The third bonding metal pad 314 may include, e.g., copper (Cu), aluminum (Al), nickel (Ni), or tungsten (W).

Figure 9E:
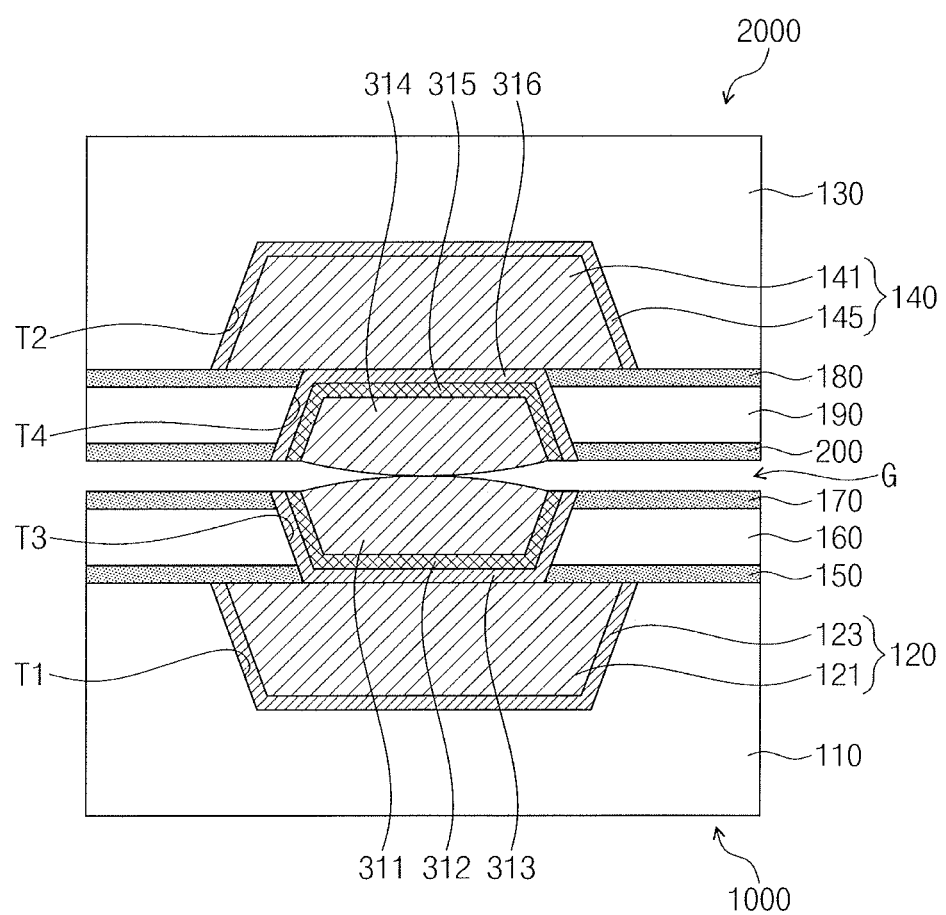

Referring to FIG. 9E, the second pad structure 2000 may be stacked on the first pad structure 1000. For example, the first connection barrier layer 316 and the third and fourth bonding metal pads 314 and 315 of the second pad structure 2000 may be on the first connection barrier layer 313 and the first and second bonding metal pads 311 and 312 of the first pad structure 1000. The first connection barrier layer 313 and the first connection barrier layer 316 may be arranged symmetrically to each other, and the second bonding metal pad 312 and the fourth bonding metal pad 315 may be arranged symmetrically to each other. The first bonding metal pad 311 and the third bonding metal pad 314 may be arranged symmetrically to each other. Because each of the first bonding metal pad 311 and the third bonding metal pad 314 has the convexly curved top surface, when the first bonding metal pad 311 and the third bonding metal pad 314 are in contact with each other, a gap G may be produced between the second buffer dielectric layer 170 and the fourth buffer dielectric layer 200. Therefore, the second buffer dielectric layer 170 and the fourth buffer dielectric layer 200 may be spaced apart from each other.

An annealing process may be performed on the first pad structure 1000 and the second pad structure 2000 that are stacked one atop the other in FIG. 9E. The annealing process may allow the first connection barrier layer 313 and the first connection barrier layer 316 to combine with each other to form a connection metal barrier layer 220. The annealing process may allow the first bonding metal pad 311, the second bonding metal pad 312, the third bonding metal pad 314, and the fourth bonding metal pad 315 to combine with each other to form a pad connector 210. The annealing process may be performed at about 250° C. to about 350° C. The connection metal barrier layer 220 may surround the pad connector 210. The pad connector 210 may be an intermetallic compound (IMC) that is formed when the first to fourth bonding metal pads 311, 312, 314, and 315 are combined with each other. When the first and third bonding metal pads 311 and 314 include copper, the copper may have a face-centered cubic (FCC) lattice structure. When the second and fourth bonding metal pads 312 and 315 include tin, the tin may have a tetragonal lattice structure or a diamond cubic lattice structure. The annealing process may introduce copper atoms into the tin lattice structure and also introduce tin atoms into the copper lattice structure, and accordingly the copper and tin lattice structures may be stably rearranged. Thus, the pad connector 210 in which copper and tin are combined with each other may have a volume that is less than a sum of those of the first bonding metal pad 311, the second bonding metal pad 312, the third bonding metal pad 314, and the fourth bonding metal pad 315 that do not yet undergo the annealing process. The reduction in volume of the pad connector 210 may eliminate the gap G between the second buffer dielectric layer 170 and the fourth buffer dielectric layer 200, with the result that the second buffer dielectric layer 170 and the fourth buffer dielectric layer 200 may be in contact with each other, as shown in FIGS. 1 and 2.

In an implementation, the annealing process may cause the reduction in volume of the pad connector 210 including a copper-tin compound, and the gap G between the second buffer dielectric layer 170 and the fourth buffer dielectric layer 200 may be eliminated to increase an adhesion force therebetween, which may result in that semiconductor devices have improved yield.

In addition, as shown in FIG. 9E, the second bonding metal pad 312 (or the fourth bonding metal pad 315) including tin may be between the first bonding metal pad 311 (or the third bonding metal pad 314) including copper and the first connection barrier layer 313 (or the first connection barrier layer 316) including titanium or tantalum, and galvanic corrosion may be avoided between the pad connector 210 and the connection metal barrier layer 220.

Figure 10A:
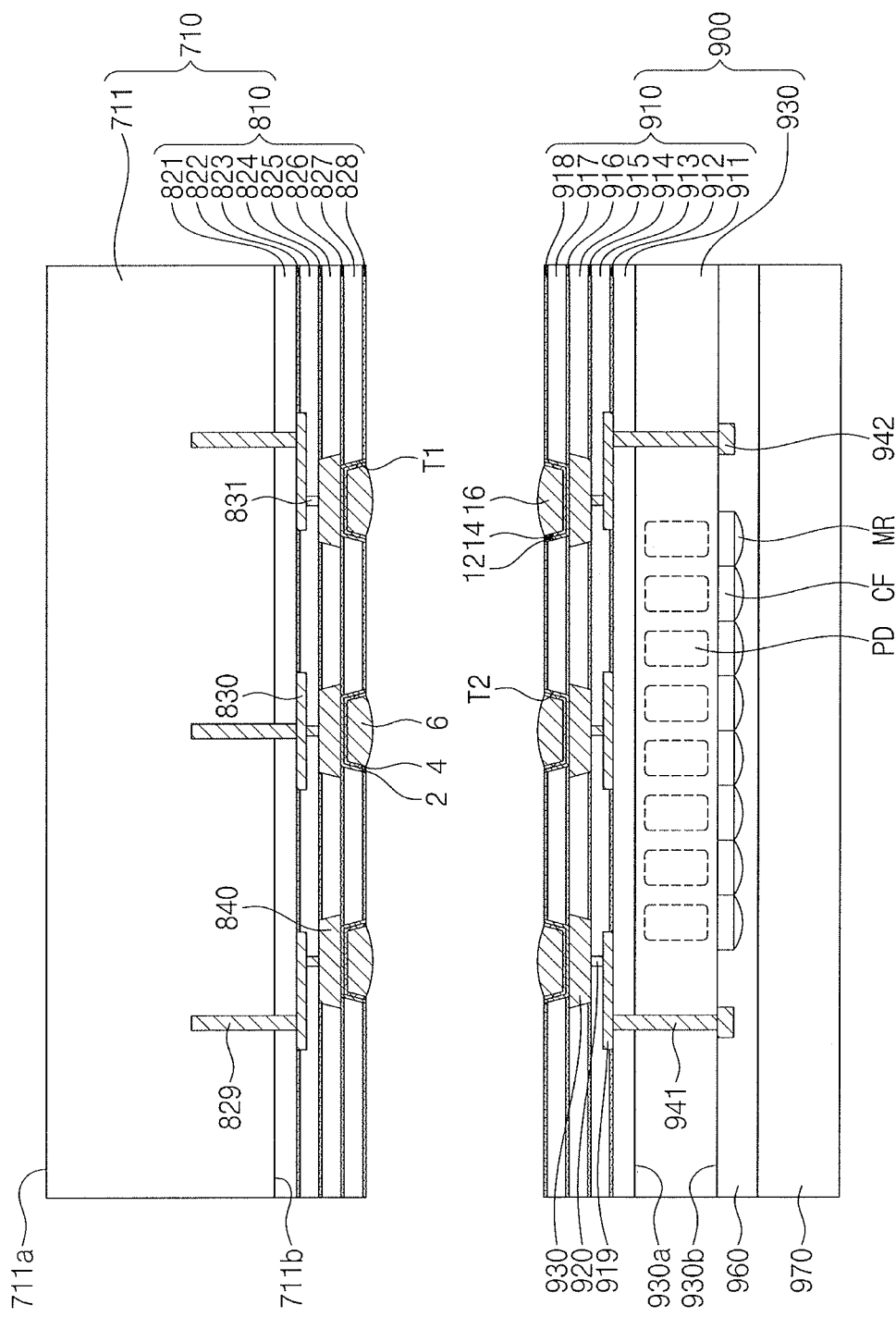
FIGS. 10A to 10C illustrate cross-sectional views of stages in a method of fabricating a semiconductor package according to some example embodiments.
Figure 10B:
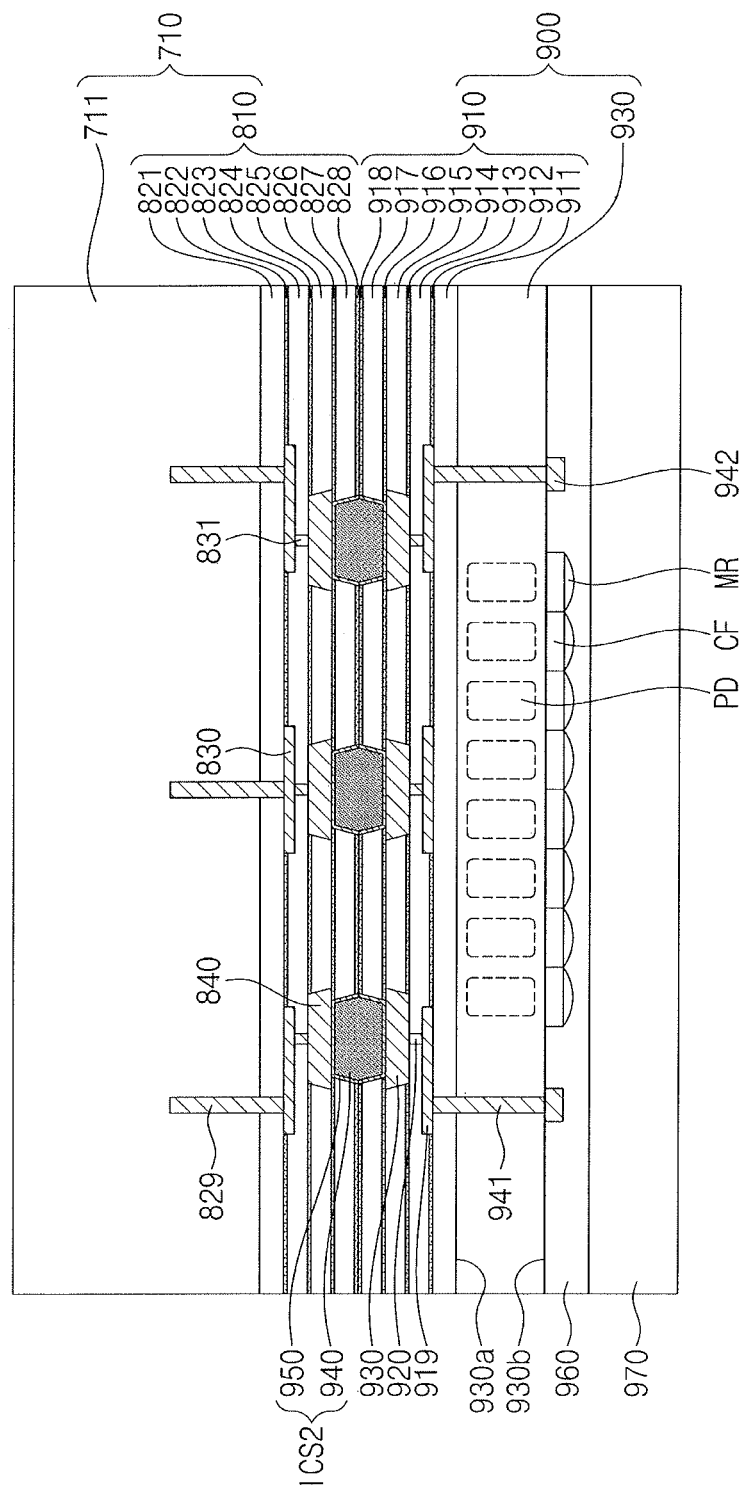
Figure 10C:
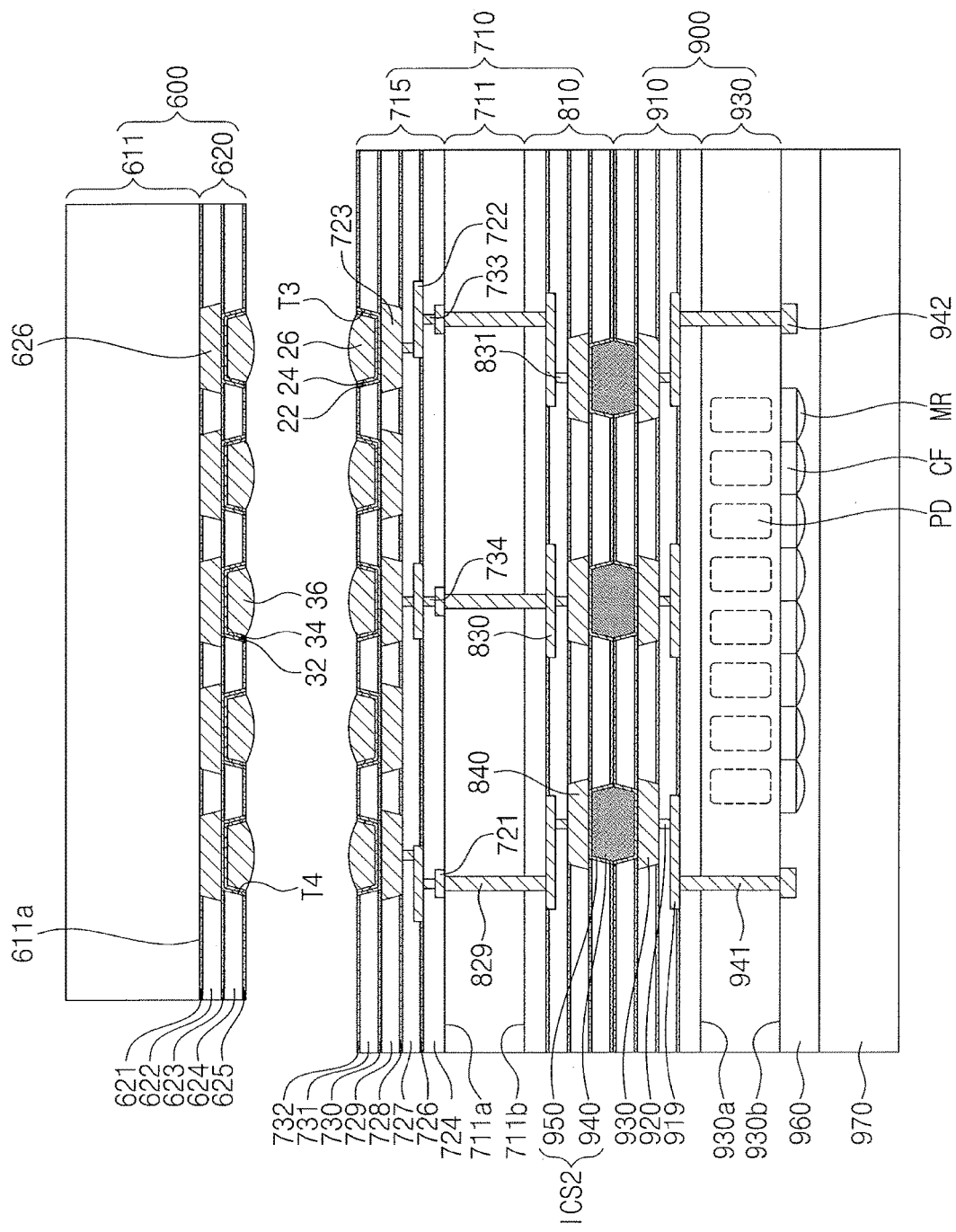

FIGS. 10A to 10C illustrate cross-sectional views of stages in a method of fabricating a semiconductor package according to some example embodiments.

Referring to FIG. 10A, a second semiconductor chip 710 and a third semiconductor chip 900 may be prepared. The second semiconductor chip 710 may include a second semiconductor layer 711 and a third connection line structure 810. The third connection line structure 810 may be on a second surface 711b of the second semiconductor layer 711, which second surface 711b faces a first surface 711a of the second semiconductor layer 711. The third connection line structure 810 may include eighth to eleventh interlayer dielectric layers 821, 823, 825, and 827, seventh to tenth buffer dielectric layers 822, 824, 826, and 828, a first through via 829, a third via 831, fifth and sixth pads 830 and 840, a first connection barrier layer 2, a first bonding metal pad 4, and a second bonding metal pad 6. The eighth interlayer dielectric layer 821 may be disposed on the second surface 711b of the second semiconductor layer 711. The first through via 829 may penetrate the eighth interlayer dielectric layer 821 and a portion of the second semiconductor layer 711. The seventh buffer dielectric layer 822 and the ninth interlayer dielectric layer 823 may be sequentially formed on the eighth interlayer dielectric layer 821. The fifth pad 830 and the third via 831 may be formed in the seventh buffer dielectric layer 822 and the ninth interlayer dielectric layer 823. The fifth pad 830 may contact the first through via 829, and the third via 831 may contact the fifth pad 830.

The eighth buffer dielectric layer 824 and the tenth interlayer dielectric layer 825 may be sequentially formed on the ninth interlayer dielectric layer 823. The sixth pads 840 may be formed to penetrate the eighth buffer dielectric layer 824 and the tenth interlayer dielectric layer 825. The sixth pad 840 may be formed to contact the third via 831. The ninth buffer dielectric layer 826, the eleventh interlayer dielectric layer 827, and the tenth buffer dielectric layer 828 may be sequentially formed on the tenth interlayer dielectric layer 825. A first trench T1 may be formed by patterning the ninth buffer dielectric layer 826, the eleventh interlayer dielectric layer 827, and the tenth buffer dielectric layer 828. The first trench T1 may expose the sixth pad 840. The first connection barrier layer 2, the first bonding metal pad 4, and the second bonding metal pad 6 may be formed in the first trench T1. The first connection barrier layer 2, the first bonding metal pad 4, and the second bonding metal pad 6 may be formed by sequentially forming a first metal layer, a second metal layer, and a third metal layer in the first trench T1, and then performing a planarization process. The planarization process may allow the second bonding metal pad 6 to have a convexly curved top surface. The first connection barrier layer 2 may include, e.g., titanium (Ti) or tantalum (Ta). The first bonding metal pad 4 may include, e.g., tin (Sn). The second bonding metal pad 6 may include, e.g., copper (Cu), aluminum (Al), nickel (Ni), or tungsten (W).

The third semiconductor chip 900 may include a third semiconductor layer 930 and a fourth connection line structure 910. Photoelectric conversion devices PD may be in the third semiconductor layer 930. The photoelectric conversion devices PD may be formed by anion implantation process in which the third semiconductor layer 930 is doped with impurities. Color filters CF may be formed on a second surface 930b of the third semiconductor layer 930, and micro-lenses MR may be formed on the color filters CF. Second bonding pads 942 may be formed on the second surface 930b of the third semiconductor layer 930. A carrier adhesive layer 960 may be formed on the second surface 930b of the third semiconductor layer 930. The carrier adhesive layer 960 may cover the color filters CF and the micro-lenses MR. A carrier substrate 970 may be attached to the carrier adhesive layer 960.

The fourth connection line structure 910 may be formed on a first surface 930a of the third semiconductor layer 930. The fourth connection line structure 910 may include twelfth to fifteenth interlayer dielectric layers 911, 913, 915, and 917, eleventh to fourteenth buffer dielectric layers 912, 914, 916, and 918, a fourth via 920, seventh and eighth pads 919 and 938, a second connection barrier layer 12, a third bonding metal pad 14, and a fourth bonding metal pad 16. The twelfth interlayer dielectric layer 911 may be formed on the first surface 930a of the third semiconductor layer 930. A second through via 941 may be formed in the third semiconductor layer 930 and the twelfth interlayer dielectric layer 911. The second through via 941 may contact the second bonding pad 942. The eleventh buffer dielectric layer 912 and the thirteenth interlayer dielectric layer 913 may be formed on the twelfth interlayer dielectric layer 911. The seventh pad 919 may be formed in the eleventh buffer dielectric layer 912 and the thirteenth interlayer dielectric layer 913. The seventh pad 919 may contact the second through via 941. The fourth via 920 may be formed in the thirteenth interlayer dielectric layer 913. The fourth via 290 may contact the seventh pad 919.

The twelfth buffer dielectric layer 914 and the fourteenth interlayer dielectric layer 915 may be formed on the thirteenth interlayer dielectric layer 913. The eighth pad 938 may penetrate the twelfth buffer dielectric layer 914 and the fourteenth interlayer dielectric layer 915. The eighth pad 938 may contact the fourth pad 920. The thirteenth buffer dielectric layer 916, the fifteenth interlayer dielectric layer 917, and the fourteenth buffer dielectric layer 918 may be formed on the fourteenth interlayer dielectric layer 915. A second trench T2 may be formed by patterning the thirteenth buffer dielectric layer 916, the fifteenth interlayer dielectric layer 917, and the fourteenth buffer dielectric layer 918. The second trench T2 may expose the eighth pad 938. The second connection barrier layer 12, the third bonding metal pad 14, and the fourth bonding metal pad 16 may be formed in the second trench T2. The second connection barrier layer 12, the third bonding metal pad 14, and the fourth bonding metal pad 16 may be formed by sequentially forming a fourth metal layer, a fifth metal layer, and a sixth metal layer in the second trench T2, and then performing a planarization process. The planarization process may allow the fourth bonding metal pad 16 to have a convexly curved top surface. The second connection barrier layer 12 may include, e.g., titanium (Ti) or tantalum (Ta). The third bonding metal pad 14 may include, e.g., tin (Sn). The fourth bonding metal pad 16 may include, e.g., copper (Cu), aluminum (Al), nickel (Ni), or tungsten (W).

Referring to FIG. 10B, the second semiconductor chip 710 and the third semiconductor chip 900 may be combined with each other. For example, the combination of the second semiconductor chip 710 with the third semiconductor chip 900 may include placing the first connection barrier layer 2, the first bonding metal pad 4, and the second bonding metal pad 6 of the second semiconductor chip 710 on the second connection barrier layer 12, the third bonding metal pad 14, and the fourth bonding metal pad 16 of the third semiconductor chip 900, and performing an annealing process to combine the first and second connection barrier layers 2 and 12 and the first to fourth bonding metal pads 4, 16, 14, and 16 with each other to form a second interconnection structure ICS2. The annealing process may be performed at about 250° C. to about 350° C. The second interconnection structure ICS2 may include a second pad connector 940 and a second connection metal barrier layer 950. The tenth buffer dielectric layer 828 and the fourteenth buffer dielectric layer 918 may be in contact with each other.

Referring to FIG. 10C, a grinding process may be performed on the first surface 711a of the second semiconductor layer 711. The grinding process may continue until the first through via 829 is exposed. Thus, the second semiconductor layer 711 may become reduced in thickness.

A second connection line structure 715 may be formed on the first surface 711a of the second semiconductor layer 711. The second semiconductor chip 710 may further include the second connection line structure 715. The second connection line structure 715 may include second to fourth pads 721, 722, and 723, a fourth interlayer dielectric layer 724, a third buffer dielectric layer 726, a fifth interlayer dielectric layer 727, a fourth buffer dielectric layer 728, a sixth interlayer dielectric layer 729, a fifth buffer dielectric layer 730, a seventh interlayer dielectric layer 731, a sixth buffer dielectric layer 732, a first via 733, a second via 734, a third connection barrier layer 22, a fifth bonding metal pad 24, and a sixth bonding metal pad 26. The second pad 721 may be formed on the first surface 711a of the second semiconductor layer 711. The second pad 721 may contact the first through via 829. The fourth interlayer dielectric layer 724 may be formed on the first surface 711a of the second semiconductor layer 711. The fourth interlayer dielectric layer 724 may cover the second pad 721. The first via 733 may be formed in the fourth interlayer dielectric layer 724. The first via 733 may contact the second pad 721. The third buffer dielectric layer 726 and the fifth interlayer dielectric layer 727 may be sequentially formed on the fourth interlayer dielectric layer 724. The third pad 722 may be formed in the third buffer dielectric layer 726 and the fifth interlayer dielectric layer 727, and the second via 734 may be formed in the fifth interlayer dielectric layer 727 and in contact with the third pad 722. The fourth buffer dielectric layer 728 and the sixth interlayer dielectric layer 729 may be sequentially formed on the fifth interlayer dielectric layer 727. The fourth pad 723 may be formed to penetrate the fourth buffer dielectric layer 728 and the sixth interlayer dielectric layer 729. The fourth pad 723 may contact the second via 734.

The fifth buffer dielectric layer 730, the seventh interlayer dielectric layer 731, and the sixth buffer dielectric layer 732 may be sequentially formed on the sixth interlayer dielectric layer 729. A third trench T3 may be formed by patterning the fifth buffer dielectric layer 730, the seventh interlayer dielectric layer 731, and the sixth buffer dielectric layer 732. The third trench T3 may expose the fourth pad 723. The third connection barrier layer 22, the fifth bonding metal pad 24, and the sixth bonding metal pad 26 may be formed in the third trench T3. The third connection barrier layer 22, the fifth bonding metal pad 24, and the sixth bonding metal pad 26 may be formed by sequentially forming a seventh metal layer, an eighth metal layer, and a ninth metal layer in the third trench T3, and then performing a planarization process. The planarization process may allow the sixth bonding metal pad 26 to have a convexly curved top surface. The third connection barrier layer 22 may include, e.g., titanium (Ti) or tantalum (Ta). The fifth bonding metal pad 24 may include, e.g., tin (Sn). The sixth bonding metal pad 26 may include, e.g., copper (Cu), aluminum (Al), nickel (Ni), or tungsten (W).

A first semiconductor chip 600 may be prepared. The first semiconductor chip 600 may include a first semiconductor layer 611 and a first connection line structure 620. The first connection line structure 620 may be formed on a first surface 611a of the first semiconductor layer 611. The first connection line structure 620 may include a first buffer dielectric layer 621, a first interlayer dielectric layer 622, a second buffer dielectric layer 623, a second interlayer dielectric layer 624, a third buffer dielectric layer 625, a first pad 626, a fourth connection barrier layer 32, a seventh bonding metal pad 34, and an eighth bonding metal pad 36. The first buffer dielectric layer 621 and the first interlayer dielectric layer 622 may be sequentially formed on the first surface 611a of the first semiconductor layer 611. The first pad 626 may penetrate the first buffer dielectric layer 621 and the first interlayer dielectric layer 622. The first pad 626 may contact the first surface 611a of the first semiconductor layer 611. The second buffer dielectric layer 623, the second interlayer dielectric layer 624, and the third buffer dielectric layer 625 may be sequentially formed on the first interlayer dielectric layer 622. A fourth trench T4 may be formed by patterning the second buffer dielectric layer 623, the second interlayer dielectric layer 624, and the third buffer dielectric layer 625. The fourth trench T4 may expose the first pad 626. The fourth connection barrier layer 32, the seventh bonding metal pad 34, and the eighth bonding metal pad 36 may be formed in the fourth trench T4. The fourth connection barrier layer 32, the seventh bonding metal pad 34, and the eighth bonding metal pad 36 may be formed by sequentially forming a tenth metal layer, an eleventh metal layer, and a twelfth metal layer in the fourth trench T4, and then performing a planarization process. The planarization process may allow the eighth bonding metal pad 36 to have a convexly curved top surface. The fourth connection barrier layer 32 may include, e.g., titanium (Ti) or tantalum (Ta). The seventh bonding metal pad 34 may include, e.g., tin (Sn). The eighth bonding metal pad 36 may include, e.g., copper (Cu), aluminum (Al), nickel (Ni), or tungsten (W).

Referring back to FIG. 6, the second semiconductor chip 710 and the first semiconductor chip 600 may be combined with each other. For example, the combination of the second semiconductor chip 710 with the first semiconductor chip 600 may include placing the third connection barrier layer 22, the fifth bonding metal pad 24, and the sixth bonding metal pad 26 of the second semiconductor chip 710 on the fourth connection barrier layer 32, the seventh bonding metal pad 34, and the eighth bonding metal pad 36 of the first semiconductor chip 600, and performing an annealing process to combine the third and fourth connection barrier layers 22 and 32 and the fifth to eighth bonding metal pads 24, 26, 34, and 36 with each other to form a first interconnection structure ICS1. The annealing process may be performed at about 250° C. to about 350° C. The first interconnection structure ICS1 may include a first pad connector 740 and a first connection metal barrier layer 750. The third buffer dielectric layer 625 and the sixth buffer dielectric layer 732 may be in contact with each other.

A package substrate 500 may be provided thereon with a chip structure in which the first, second, and third semiconductor chips 600, 710, and 900 are combined with each other. An adhesive layer 601 may be provided on a second surface of the first semiconductor chip 600, which second surface faces the first surface 611a, and the adhesive layer 601 may be used to mount the chip structure on the package substrate 500. A molding layer 650 may be formed on the package substrate 500. The molding layer 650 may cover sidewalls of the first semiconductor chip 600. The package substrate 500 may include first bonding pads 510 formed on a top surface thereof and bumps 520 formed on an opposing bottom surface thereof. The carrier adhesive layer 960 and the carrier substrate 970 may be removed to expose the micro-lenses MR and the second bonding pads 942. Bonding wires 943 may be formed between the first bonding pads 510 and the second bonding pads 942. A holder 980 may be provided on the package substrate 500. The holder 980 may support a lens 982.

By way of summation and review, a pad connector having insufficient volume may result in a void in the pad. However, increasing the volume of the pad connector may result in a gap between dielectric layers.

According to some example embodiments, an annealing process may cause a reduction in volume of a pad connector including a copper-tin compound, and the volume reduction may eliminate a gap between buffer dielectric layers. The buffer dielectric layers may thus have an increased adhesion force therebetween, and accordingly a semiconductor device may increase in yield.

In addition, a bonding metal pad including tin may be formed between a bonding metal pad including copper and a connection barrier layer including titanium or tantalum, and galvanic corrosion may be avoided between a connection metal barrier layer and a pad connector that is formed by a combination of the copper-containing bonding metal pad and the tin-containing bonding metal pad.

One or more embodiments may provide a semiconductor device with improved reliability.

One or more embodiments may provide a semiconductor package with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a first buffer dielectric layer on a first dielectric layer;
a second dielectric layer and a second buffer dielectric layer sequentially disposed on the first buffer dielectric layer, the second buffer dielectric layer being in contact with the first buffer dielectric layer; and a pad interconnection structure that penetrates the first buffer dielectric layer and the second buffer dielectric layer, wherein:

the pad interconnection structure includes copper and tin, the pad interconnection structure includes:
- a central part,
- a first intermediate part surrounding the central part,
- a second intermediate part surrounding the first intermediate part, and
- an outer part surrounding the second intermediate part, a grain size of the outer part is less than a grain size of the second intermediate part, the grain size of the second intermediate part is less than a grain size of the first intermediate part, and the grain size of the first intermediate part is less than a grain size of the central part.

2. The semiconductor device as claimed in claim 1, wherein:

the pad interconnection structure includes a pad connector and a connection metal barrier layer surrounding the pad connector, the pad connector including the central part, the first intermediate part, the second intermediate part, and the outer part, and the pad connector includes the copper and the tin.

3. The semiconductor device as claimed in claim 2, wherein:

an amount of tin contained in the pad interconnection structure decreases in a direction toward the central part of the pad connector from the outer part of the pad connector, and an amount of copper contained in the pad interconnection structure increases in the direction toward the central part from the outer part.

4. The semiconductor device as claimed in claim 1, wherein:

the pad interconnection structure includes a pad connector and a connection metal barrier layer surrounding the pad connector, the pad connector including the central part, the first intermediate part, the second intermediate part, and the outer part, and the connection metal barrier layer surrounds the outer part of the pad connector.

5. The semiconductor device as claimed in claim 4, wherein the first intermediate part includes $Cu_3Sn$, and the second intermediate part includes $Cu_6Sn_5$.

6. The semiconductor device as claimed in claim 4, wherein an amount of copper contained in the central part is greater than an amount of copper contained in the outer part, and an amount of tin contained in the central part is less than an amount of tin contained in the outer part.

7. The semiconductor device as claimed in claim 1, further comprising:

a first pad in a first trench in the first dielectric layer; and a second pad in a second trench in the second dielectric layer, wherein the first pad and the second pad are in contact with the pad interconnection structure.

8. The semiconductor device as claimed in claim 7, wherein:

the first pad includes:
- a first metal pad in the first trench; and
- a first metal barrier layer in the first trench and between the first metal pad and the first dielectric layer, and the second pad includes:
- a second metal pad in the second trench; and
- a second metal barrier layer in the second trench and between the second metal pad and the second dielectric layer.

9. The semiconductor device as claimed in claim 1, wherein:

the pad interconnection structure includes a pad connector and a connection metal barrier layer surrounding the pad connector, the pad connector including the central part, the first intermediate part, the second intermediate part, and the outer part, the semiconductor device further includes:
- a third dielectric layer between the first dielectric layer and the first buffer dielectric layer; and
- a fourth dielectric layer between the second dielectric layer and the second buffer dielectric layer, the pad connector includes:
- a first segment that penetrates the third dielectric layer and the first buffer dielectric layer; and
- a second segment that penetrates the fourth dielectric layer and the second buffer dielectric layer, and the first segment and the second segment are linearly symmetrical to each other.

10. The semiconductor device as claimed in claim 1, wherein:

the pad interconnection structure includes a pad connector and a connection metal barrier layer surrounding the pad connector, the pad connector including the central part, the first intermediate part, the second intermediate part, and the outer part, the semiconductor device further includes:
- a third dielectric layer between the first dielectric layer and the first buffer dielectric layer; and
- a fourth dielectric layer between the second dielectric layer and the second buffer dielectric layer, the pad connector includes:
- a first segment that penetrates the third dielectric layer and the first buffer dielectric layer; and
- a second segment that penetrates the fourth dielectric layer and the second buffer dielectric layer, and the first segment and the second segment are offset in opposite directions to each other about a plane separating the first segment and the second segment.

11. The semiconductor device as claimed in claim 1, wherein the first dielectric layer and the second dielectric layer each include a silicon oxide layer or a PETOS layer, and the first buffer dielectric layer and the second buffer dielectric layer each include a silicon oxide layer or a silicon carbonitride layer.

12. A semiconductor device, comprising:

a first dielectric layer;

a second dielectric layer on the first dielectric layer; and a pad connector between the first dielectric layer and the second dielectric layer, wherein:

the pad connector includes a central part and an outer part surrounding the central part, a grain size of the pad connector increases in a direction toward the central part from the outer part, the pad connector includes:
- a first intermediate part surrounding the central part; and
- a second intermediate part surrounding the first intermediate part, the outer part surrounds the second intermediate part, a grain size of the outer part is less than a grain size of the second intermediate part, the grain size of the second intermediate part is less than a grain size of the first intermediate part, and the grain size of the first intermediate part is less than a grain size of the central Part.

13. The semiconductor device as claimed in claim 12, wherein:

the pad connector includes tin and copper, an amount of copper contained in the pad connector increases in a direction toward the central part from the outer part, and an amount of tin contained in the pad connector decreases in a direction toward the central part from the outer part.

14. The semiconductor device as claimed in claim 12, wherein:

the first intermediate part includes $Cu_3Sn$, and the second intermediate part includes $Cu_6Sn_5$.

15. The semiconductor device as claimed in claim 12, further comprising a connection metal barrier layer surrounding the pad connector, wherein the connection metal barrier layer includes tantalum.

16. The semiconductor device as claimed in claim 12, further comprising:

a first pad in the first dielectric layer; and a second pad in the second dielectric layer, wherein the first pad includes:

a first metal pad in the first dielectric layer and having a first surface in contact with the pad connector; and a first metal barrier layer covering a second surface and sidewalls of the first metal pad, the second surface of the first metal pad facing the first surface of the first metal pad, and wherein the second pad includes:

a second metal pad in the second dielectric layer and having a first surface in contact with the pad connector; and a second metal barrier layer covering a second surface and sidewalls of the second metal pad, the second surface of the second metal pad facing the first surface of the second metal pad.

17. A semiconductor package, comprising:

a package substrate;

a first semiconductor chip on the package substrate, the first semiconductor chip including a first semiconductor layer and a first buffer dielectric layer stacked on a first surface of the first semiconductor layer;

a second semiconductor chip on the first semiconductor chip, the second semiconductor chip including a second semiconductor layer and a second buffer dielectric layer stacked on a first surface of the second semiconductor layer, the second buffer dielectric layer being in contact with the first buffer dielectric layer; and a first pad interconnection structure that penetrates the first buffer dielectric layer and the second buffer dielectric layer, wherein:

the first pad interconnection structure includes copper and tin, the first pad interconnection structure includes:

a central part, a first intermediate part surrounding the central part;

a second intermediate part surrounding the first intermediate part, and an outer part surrounding the second intermediate part, a grain size of the outer part is less than a grain size of the second intermediate part, the grain size of the second intermediate part is less than a grain size of the first intermediate part, and the grain size of the first intermediate part is less than a grain size of the central part.

* * * * *